(12) United States Patent
Jung et al.

(10) Patent No.: US 12,274,060 B2
(45) Date of Patent: Apr. 8, 2025

(54) INTEGRATED ASSEMBLIES AND METHODS OF FORMING INTEGRATED ASSEMBLIES

(71) Applicant: Micron Technology, Inc., Boise, ID (US)

(72) Inventors: Kyubong Jung, Boise, ID (US); Terry H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 17/390,415

(22) Filed: Jul. 30, 2021

(65) Prior Publication Data

US 2023/0037066 A1 Feb. 2, 2023

(51) Int. Cl.
*H10B 43/27* (2023.01)

(52) U.S. Cl.
CPC .................................. *H10B 43/27* (2023.02)

(58) Field of Classification Search
CPC ...................... H01L 27/11582; H01L 28/87–91
See application file for complete search history.

(56) References Cited

U.S. PATENT DOCUMENTS

| | | | | |
|---|---|---|---|---|
| 9,960,180 | B1* | 5/2018 | Zhou | H01L 29/40117 |
| 10,290,648 | B1 | 5/2019 | Zhou et al. | |
| 10,593,695 | B1* | 3/2020 | Kim | H10B 41/27 |
| 11,177,280 | B1* | 11/2021 | Rajashekhar | H10B 41/10 |
| 2011/0287612 | A1* | 11/2011 | Lee | H10B 43/10 |
| | | | | 257/E21.09 |
| 2014/0008714 | A1 | 1/2014 | Makala et al. | |
| 2014/0332873 | A1* | 11/2014 | Yoo | H10B 43/20 |
| | | | | 257/314 |
| 2015/0294980 | A1* | 10/2015 | Lee | H10B 43/27 |
| | | | | 438/591 |
| 2015/0364487 | A1* | 12/2015 | Yun | H10B 43/35 |
| | | | | 257/324 |
| 2016/0247679 | A1* | 8/2016 | Urayama | G06F 30/398 |
| 2018/0090329 | A1* | 3/2018 | Kim | H10B 43/35 |
| 2018/0219017 | A1* | 8/2018 | Goda | H01L 29/40117 |
| 2018/0315769 | A1* | 11/2018 | Huo | H10B 43/27 |
| 2019/0051656 | A1* | 2/2019 | Carlson | H01L 29/40117 |

(Continued)

FOREIGN PATENT DOCUMENTS

CN 109346480 B 6/2020

OTHER PUBLICATIONS

WO PCT/US2022/034589 Search Rprt., Oct. 17, 2022, Micron Technology, Inc.

(Continued)

*Primary Examiner* — Vu A Vu
*Assistant Examiner* — Valerie N Newton
(74) *Attorney, Agent, or Firm* — Wells St. John P.S.

(57) ABSTRACT

Some embodiments include an integrated assembly having a stack of alternating insulative levels and conductive levels. A pillar of channel material extends through the stack. Charge-storage-material-segments are adjacent to the conductive levels of the stack, and are between the channel material and the conductive levels. The charge-storage-material-segments contain one or more high-k oxides. At least a portion of each of the charge-storage-material-segments is vertically wider than the conductive levels. Some embodiments include methods of forming integrated assemblies.

6 Claims, 31 Drawing Sheets

(56) References Cited

U.S. PATENT DOCUMENTS

| | | | |
|---|---|---|---|
| 2019/0378858 A1 | 12/2019 | Goda et al. | |
| 2020/0185413 A1 | 6/2020 | Kim et al. | |
| 2021/0057436 A1* | 2/2021 | Kim | G11C 16/08 |
| 2021/0082955 A1* | 3/2021 | Rajashekhar | H10B 51/10 |
| 2021/0151461 A1* | 5/2021 | Shim | H10B 41/35 |
| 2021/0265385 A1* | 8/2021 | Rajashekhar | H10B 43/10 |
| 2022/0285386 A1* | 9/2022 | Said | H10B 41/10 |

OTHER PUBLICATIONS

WO PCT/US2022/034589 Writ. Opin., Oct. 17, 2022, Micron Technology, Inc.

Congedo et al., "Multi-Layered Al2O3/HfO2/SiO2/Si3N4/SiO2 Thin Dielectrics for Charge Trap Memory Applications", ECS Journal of Solid State Science and Technology 2(1), 2013, United States, 5 pages.

Maikap et al. "Very Low Voltage Operation of p-Si/Al2O3/HfO2/TiO2/Al2O3/Pt Single Quantum Well Flash Memory Devices with Good Retention", Extended Abstracts of the 2006 International Conference on Solid State Devices and Materials, 2006, Yokohama JP, pp. 582-583.

Wang et al., "Electrical Characteristics of Memory Devices with a High-k HfO2 Trapping Layer and Dual SiO2/Si3N4 Tunneling Layer", IEEE Transactions on Electron Devices vol. 54, No. 10, Oct. 2007, United States, pp. 2699-2705.

Xu et al., "Electronic Structure and Charge-Trapping Characteristics of the Al2O3—TiAlO—SiO2 Gate Stack for Nonvolatile Memory Applications", Nanoscale Research Letters, 2017, United States, 7 pages.

* cited by examiner

INTEGRATED ASSEMBLIES AND METHODS OF FORMING INTEGRATED ASSEMBLIES

TECHNICAL FIELD

Integrated assemblies (e.g., memory devices) and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Some embodiments include integrated NAND memory having high-k oxide incorporated into charge-storage-material (e.g., charge-trapping-material). Some embodiments include methods of forming such integrated NAND memory. Example embodiments are described with reference to FIGS. 5-22.

Figure 1:
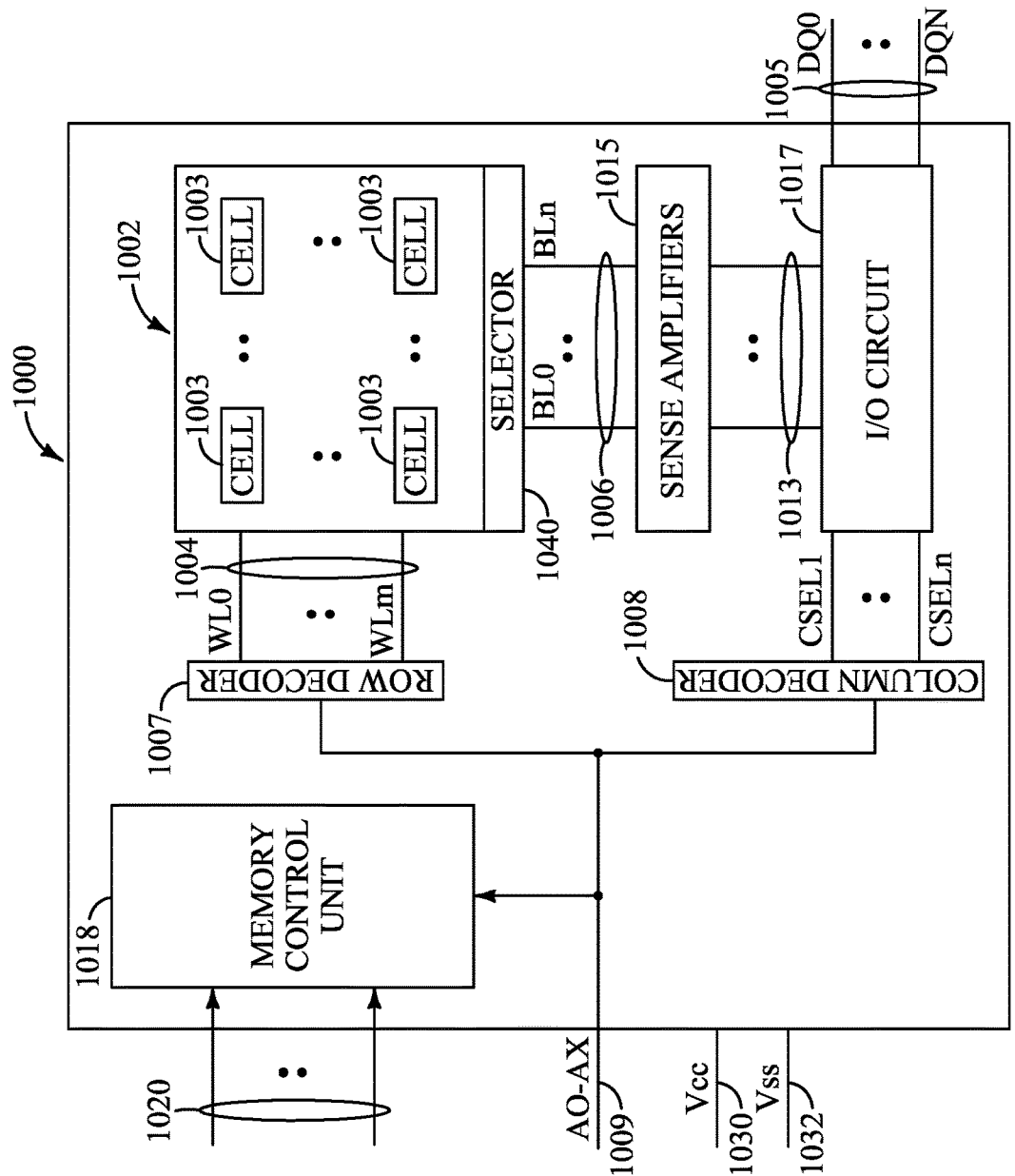
FIG. 1 shows a block diagram of a prior art memory device having a memory array with memory cells.
Figure 2:
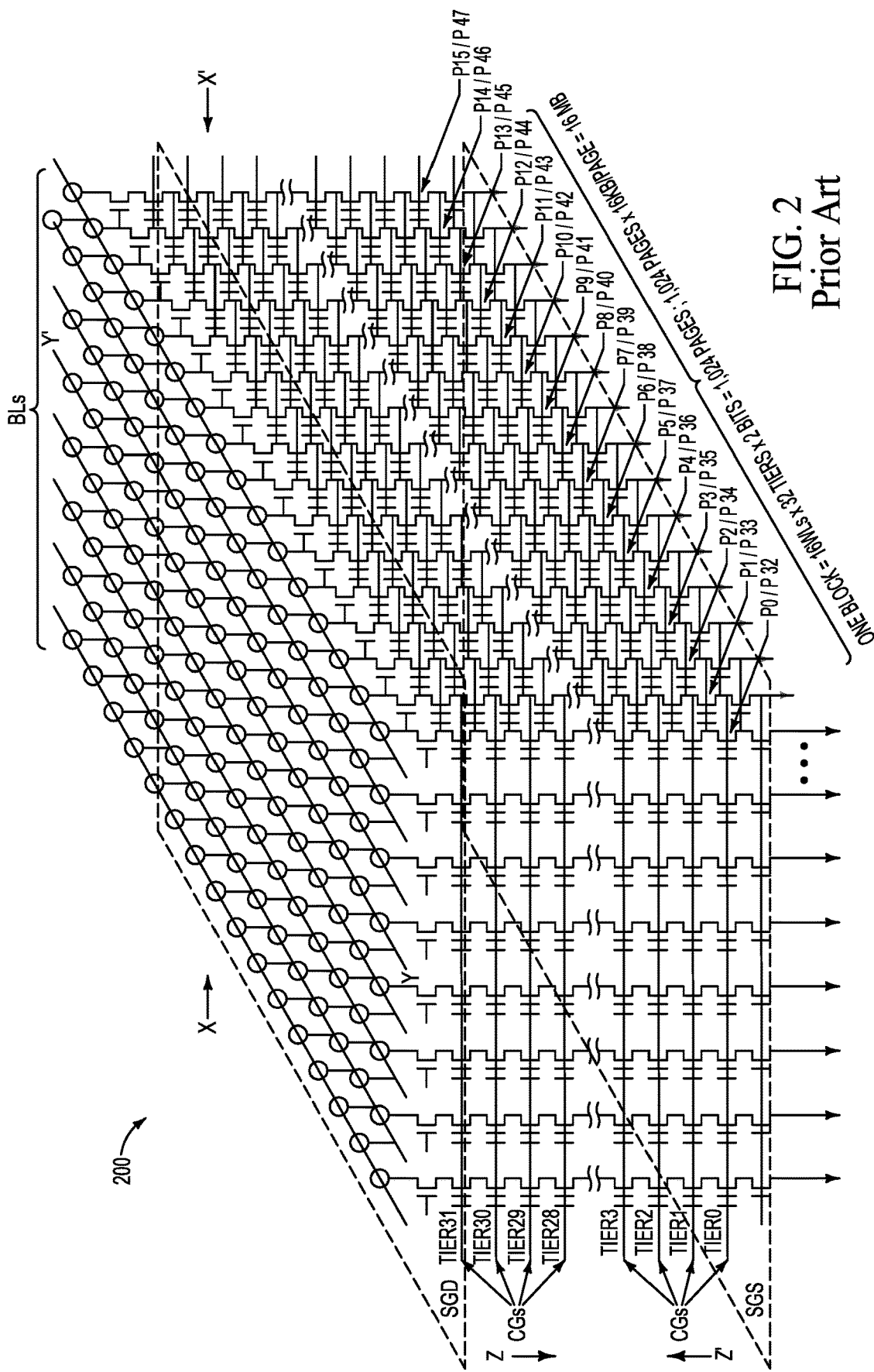
FIG. 2 shows a schematic diagram of the prior art memory array of FIG. 1 in the form of a 3D NAND memory device.
Figure 3:
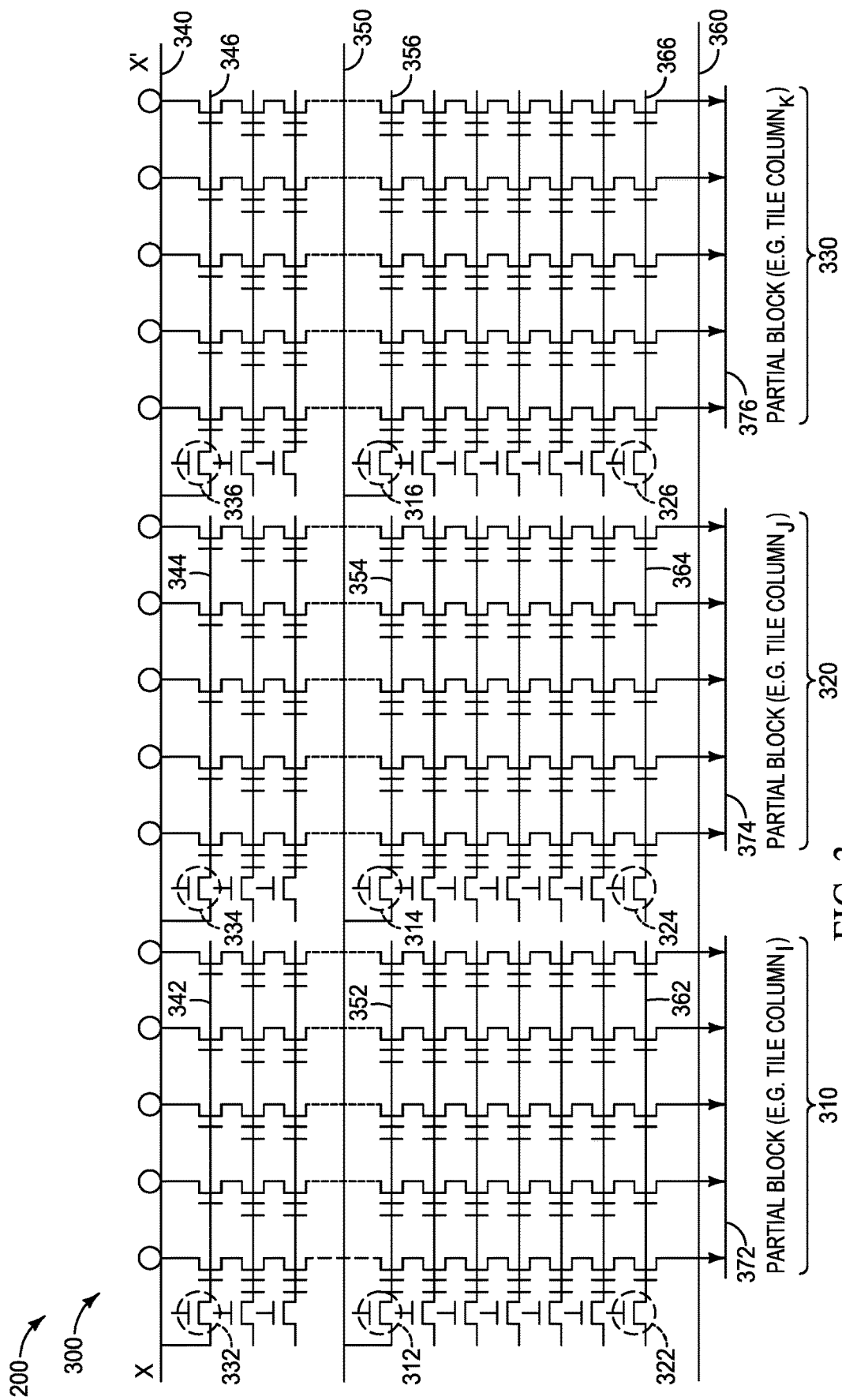
FIG. 3 shows a cross-sectional view of the prior art 3D NAND memory device of FIG. 2 in an X-X' direction.
Figure 4:
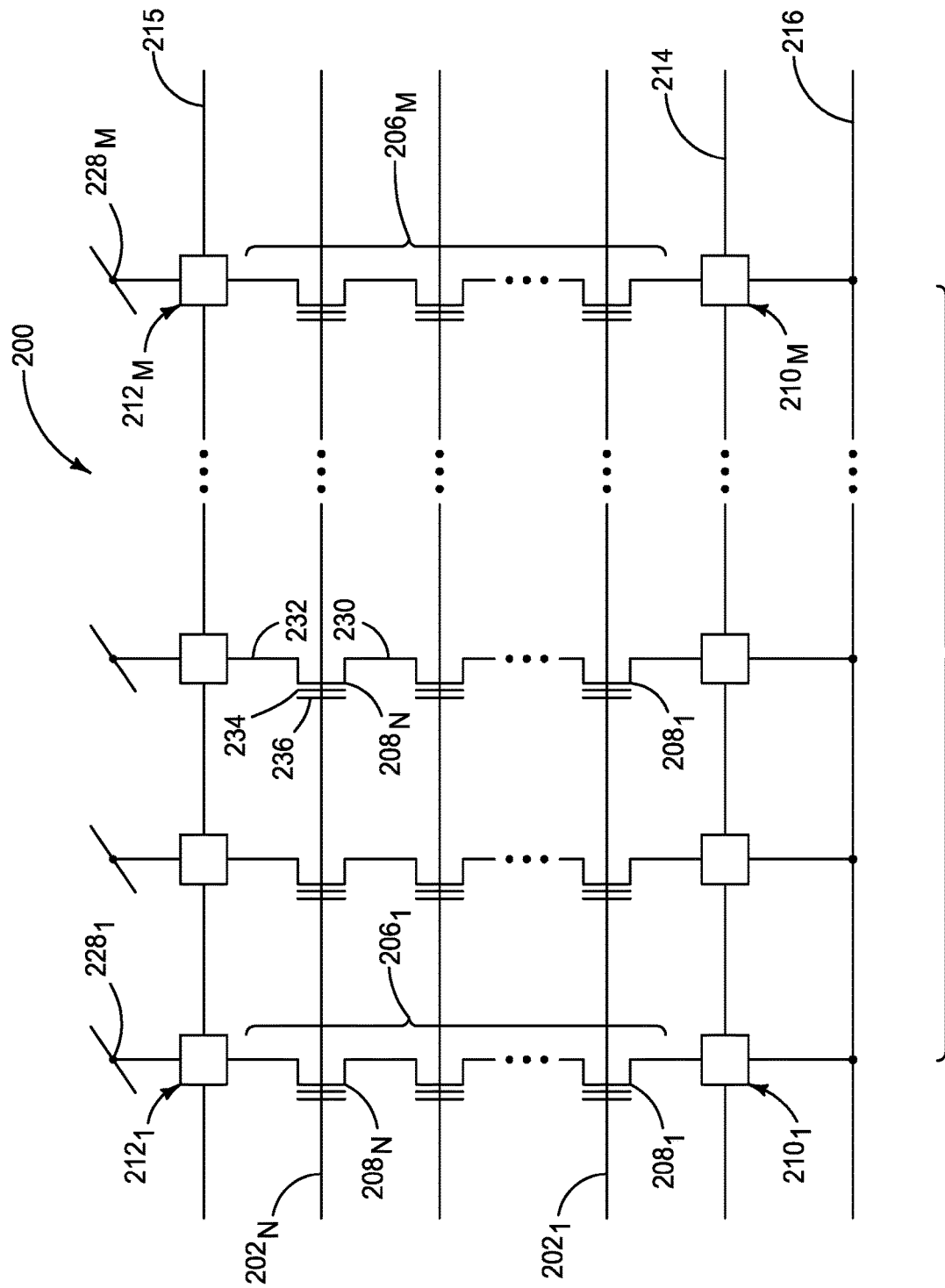
FIG. 4 is a schematic diagram of a prior art NAND memory array.
Figure 5:
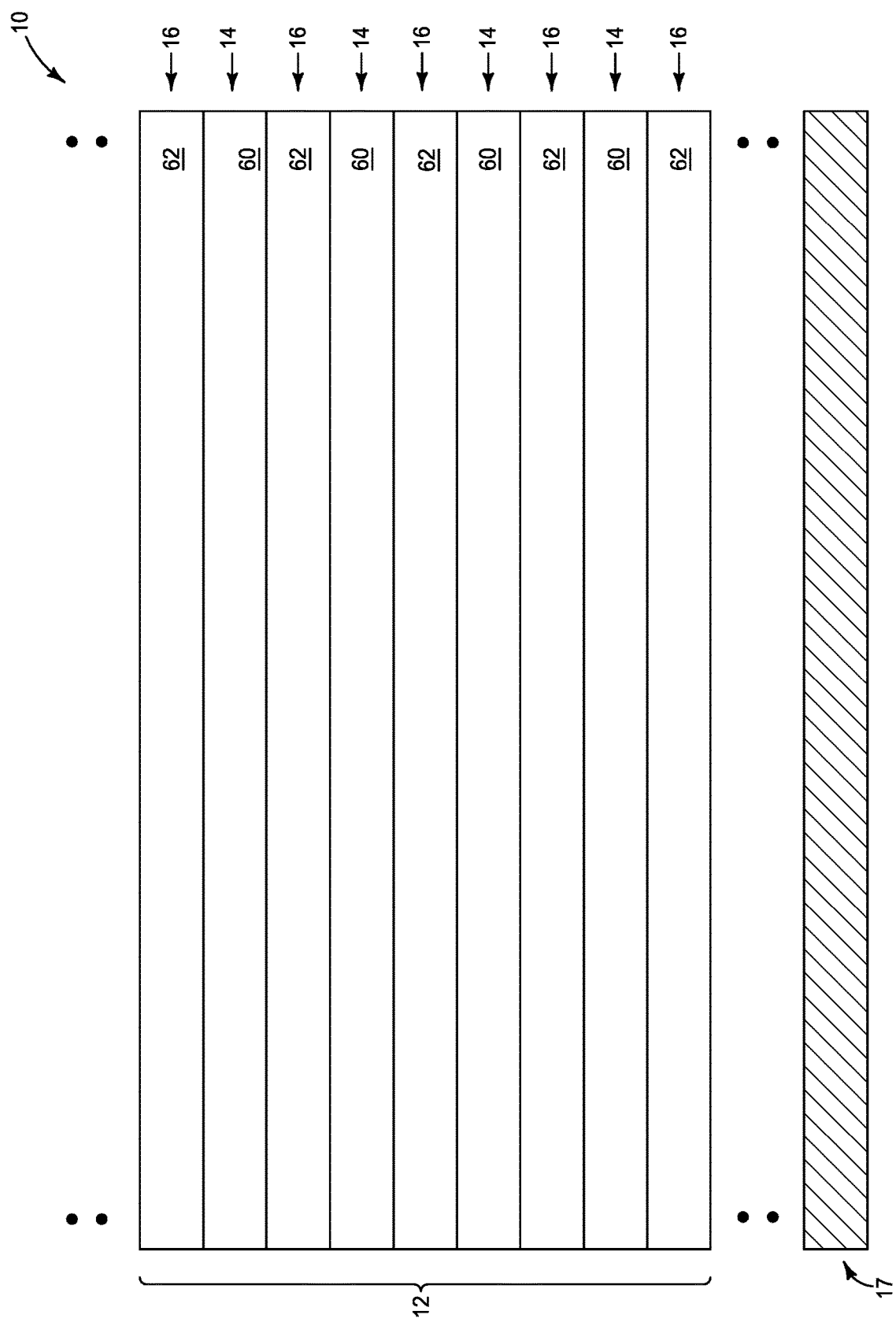
FIGS. 5 and 6 are diagrammatic cross-sectional side views of a region of an integrated assembly shown at example sequential process stages of an example method for fabricating an example memory device.

FIG. 5 shows a region of an integrated assembly (integrated structure, construction) 10 at an example process stage during the fabrication of memory cells.

The assembly 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon nitride; and the second material 62 may comprise, consist essentially of, or consist of silicon dioxide. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have vertical thicknesses within a range of from about 10 nm to about 50 nm. In some embodiments, the first and second levels 14 and 16 may have vertical thicknesses within a range of from about 15 nm to about 40 nm, within a range of from about 15 nm to about 20 nm, etc. There may be any suitable number of levels 14 and 16 within the stack 12. In some embodiments, there may be more than 10 of the levels within the stack, more than 50 of the levels within the stack, more than 100 of the levels within the stack, etc.

The stack 12 is shown to be supported by (formed over) a source structure 17.

The source structure 17 may correspond to source structures described with reference to FIGS. 1-4, and may be a line, an expanse, or any other suitable configuration. The source structure 17 may comprise any suitable materials, and in some applications may comprise conductively-doped semiconductor material (e.g., conductively-doped silicon) over metal-containing material (e.g., tungsten silicide).

The source structure 17 may be supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A gap is provided between the stack 12 and the source structure 17. The gap is utilized to indicate that other components and materials may be provided between the illustrated region of the stack 12 and the source structure 17. Such other components and materials may comprise additional levels of the stack, source-side select gates (SGSs), etc. Similarly, a gap is provided over the stack to indicate that the stack may extend upwardly beyond the illustrated region of the stack, and to indicate that other components and materials (e.g., bitlines, drain-side select gates (SGDs), etc.) may be provided over the stack.

Figure 6:
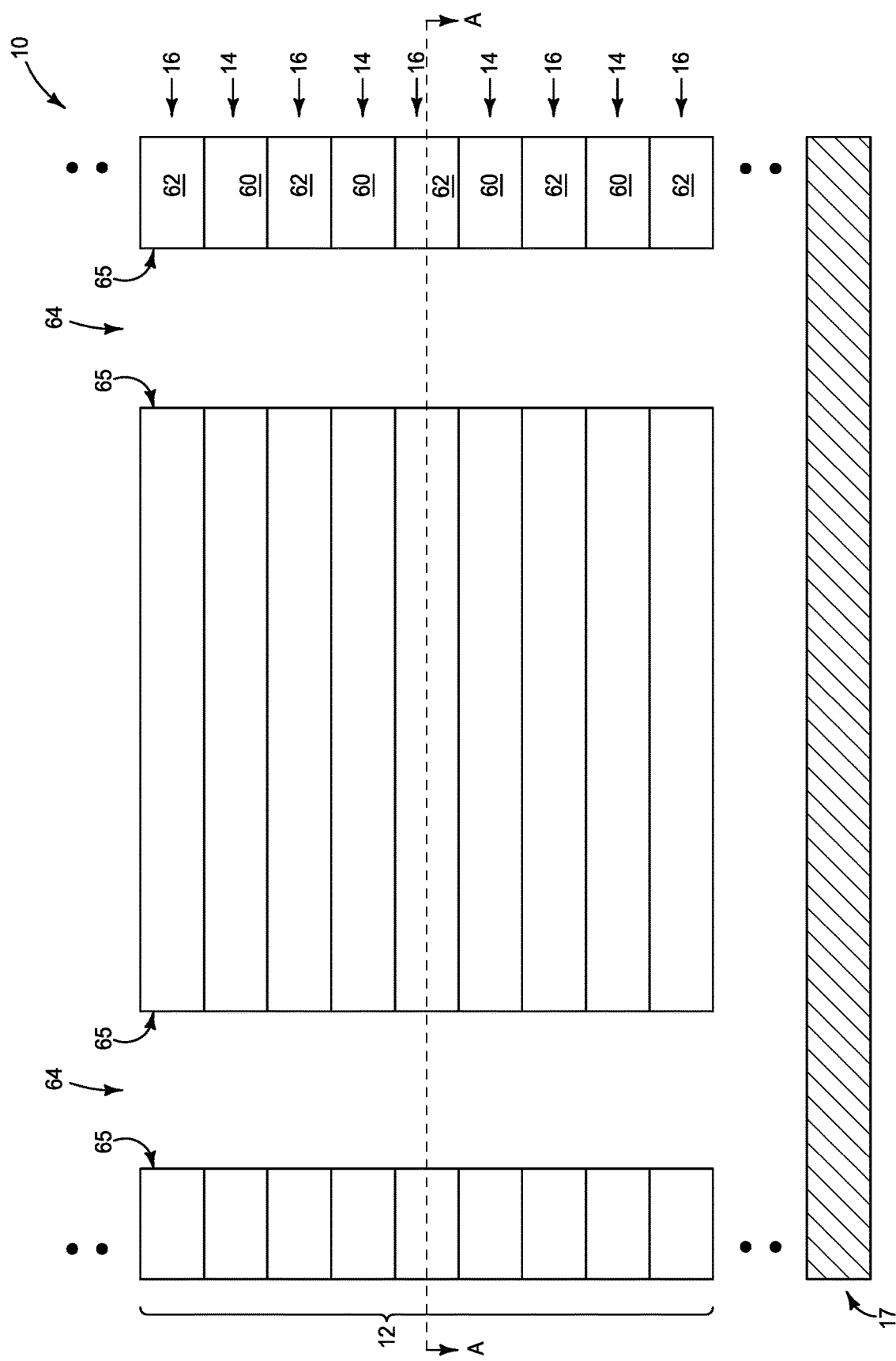
Figure 6A:
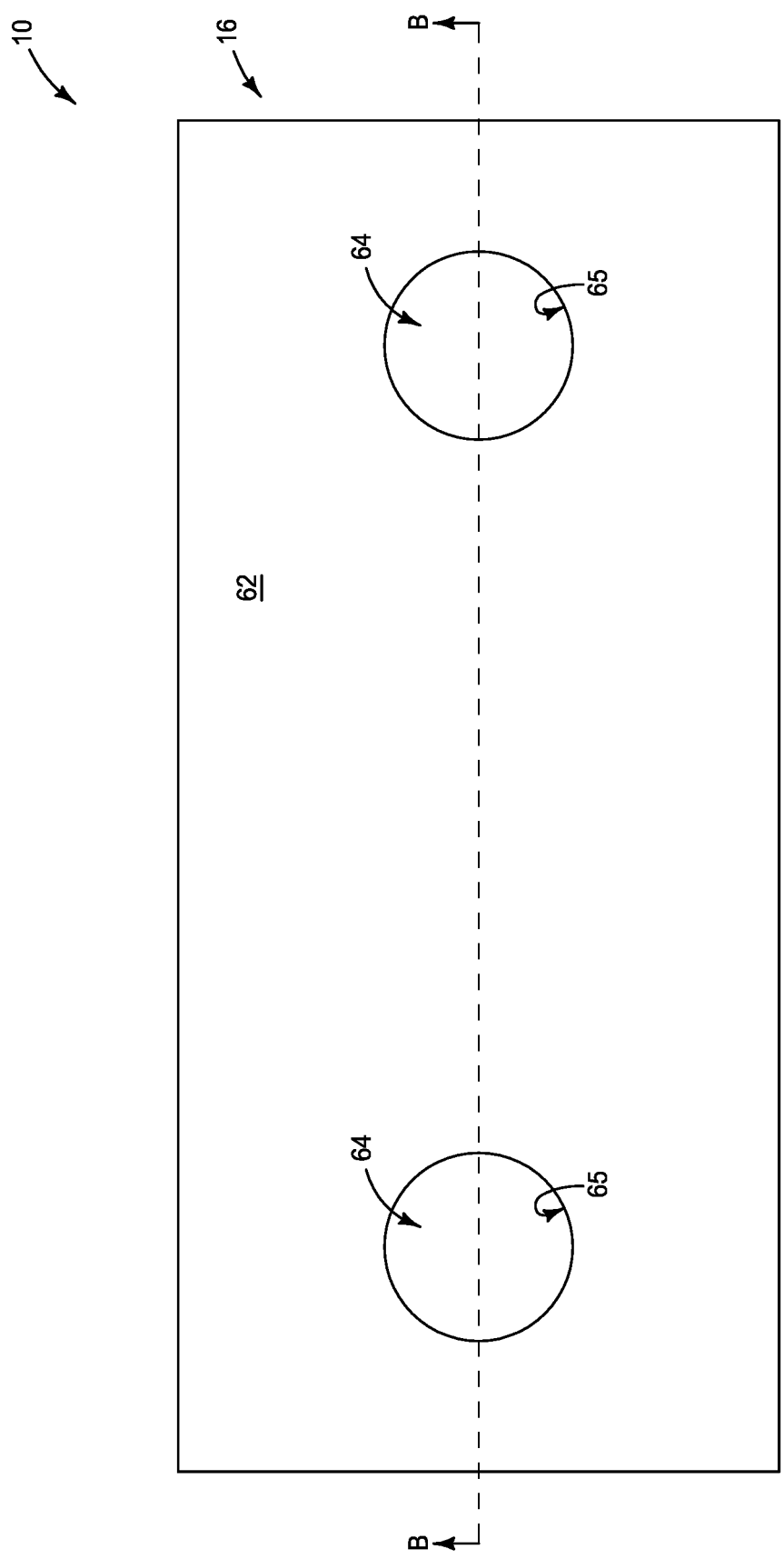
FIG. 6A is a diagrammatic sectional top-down view of the assembly of FIG. 6. The view of FIG. 6 is along the line B-B of FIG. 6A, and the view of FIG. 6A is along the line A-A of FIG. 6.

Referring to FIGS. 6 and 6A, openings 64 are formed to extend through the stack 12. The openings 64 may have any suitable shape along the top-down view of FIG. 6A, and may be circular (as shown), elliptical, square or other polygonal, etc.

The openings 64 may be representative of a large number of substantially identical openings formed at the process stage of FIGS. 6 and 6A and utilized for fabricating memory cells of a memory array (e.g., a NAND architecture). The term "substantially identical" means identical to within reasonable tolerances of fabrication and measurement.

The openings 64 have sidewalls 65 that extend across (along) the first and second levels 14 and 16.

Figure 7:
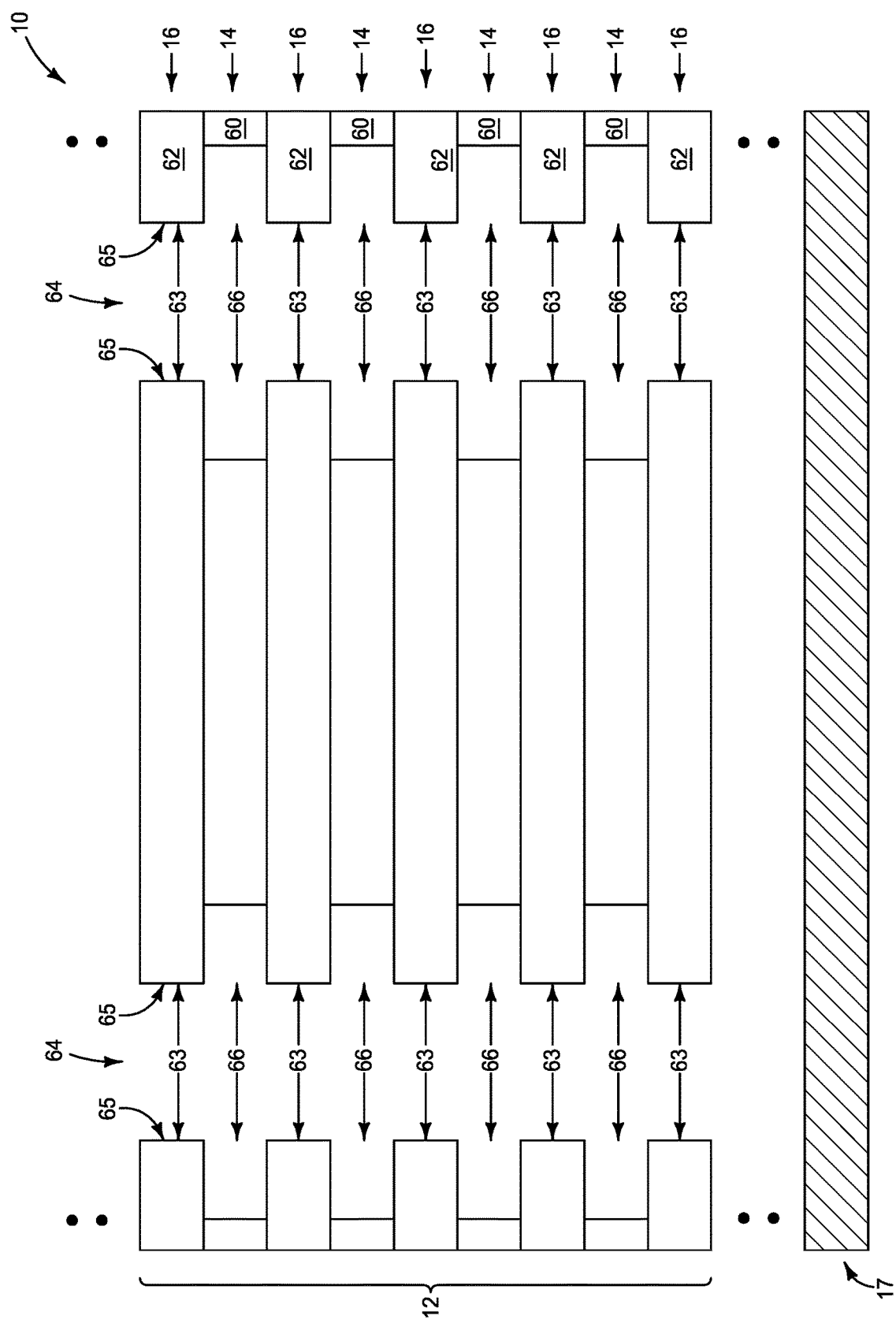
FIGS. 7-9 are diagrammatic cross-sectional side views of the region of the integrated assembly of FIG. 5 shown at example sequential process stages which may follow the process stage of FIG. 6.

Referring to FIG. 7, the first levels 14 are recessed relative to the second levels 16 to form cavities 66. The first levels 14 may be recessed by any suitable amount, and in some embodiments may be recessed to an amount within a range of from about 3 nm to about 50 nm, an amount within a range of from about 10 nm to about 20 nm, etc.

The second levels 16 have projecting terminal ends 63 which extend beyond the recessed first levels 14.

The cavities 66 are along the recessed first levels 14, and are vertically between the projecting terminal ends 63.

Figure 8:
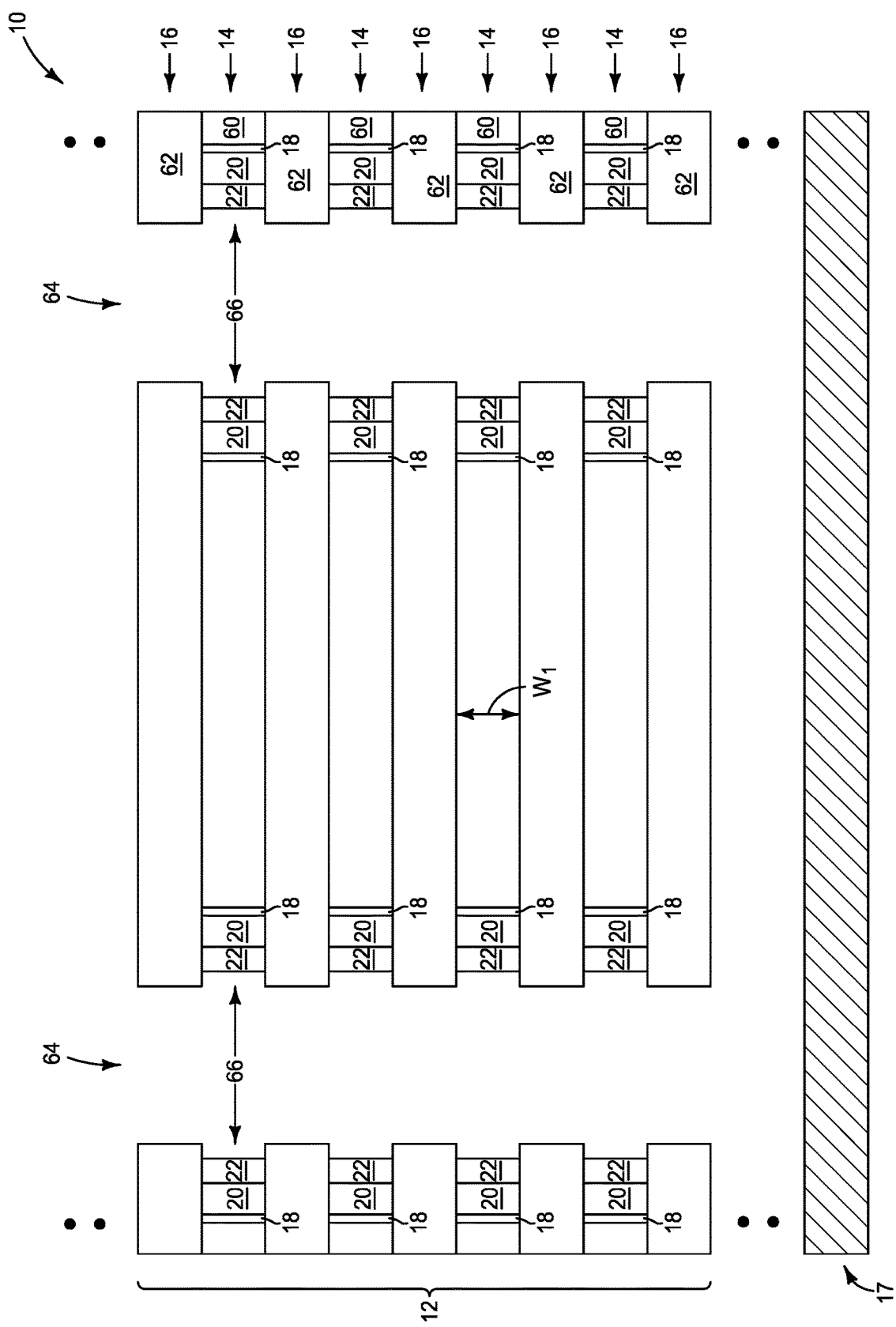

Referring to FIG. 8, spacer material 18 is formed within the cavities 66. The spacer material 18 may comprise any suitable composition(s), and in some embodiments may be insulative, semiconductive or conductive. If the spacer material 18 is insulative, the spacer material may comprise, for example, one or more of silicon dioxide, silicon oxynitride, carbon-doped silicon dioxide, etc., and may be referred to as insulative-spacer-material. If the spacer material is semiconductive, the spacer material may comprise, for example, one or more of silicon, germanium, etc., and may be referred to as semiconductive-spacer-material. If the spacer material is conductive, the spacer material may comprise, for example, one or more of metal nitride, metal carbide, metal silicide, metal germanide, metal boride, etc., and may be referred to as conductive-spacer-material. In some embodiments, the conductive-spacer-material may comprise one or both of titanium (Ti) and tantalum (Ta).

The spacer material 18 is shown to be selectively grown on exposed surfaces of the first material 60 relative to exposed surfaces of the second material 62. The spacer material 18 may be selectively grown with any suitable methodology. Example methodology may utilize, for example, one or both of atomic layer deposition (ALD) and chemical vapor deposition (CVD), and may utilize a growth promotor (accelerant) along surfaces of the first material 60 and/or a growth inhibitor (poison) along surfaces of the second material 62.

The spacer material 18 is an optional material, and may be omitted in some embodiments. However, in some embodiments it may be advantageous to utilize the spacer material to promote selective growth of another material 20 along a surface of the spacer material. In some embodiments, the spacer material may function as a seed material for promoting selective growth of the material 20.

The material 20 may be referred to as a third material, and such third material is shown to be selectively deposited within the cavities 66 and along exposed surfaces of the spacer material 18. The third material may comprise any suitable composition(s), and in some embodiments may comprise one or more of aluminum (Al), hafnium (Hf), zirconium (Zr), titanium (Ti), lanthanum (La), scandium (Sc) and tantalum (Ta). The third material 20 may be selectively grown with any suitable methodology. Example methodology may utilize, for example, one or both of atomic layer deposition (ALD) and chemical vapor deposition (CVD), and may utilize a growth promotor (accelerant)

along surfaces of the spacer material 18 and/or a growth inhibitor (poison) along surfaces of the second material 62. In some embodiments, the spacer material 18 may be omitted, and the third material 20 may be selectively grown on exposed surfaces of the first material 60 relative to exposed surfaces of the second material 62.

A fourth material 22 is selectively grown on exposed surfaces of the third material 20 relative to exposed surfaces of the second material 62. The fourth material may comprise any suitable composition(s), and in some embodiments may comprise one or more of aluminum (Al), hafnium (Hf), zirconium (Zr), titanium (Ti), lanthanum (La), scandium (Sc) and tantalum (Ta). The fourth material 22 may be selectively grown with any suitable methodology. Example methodology may utilize, for example, one or both of atomic layer deposition (ALD) and chemical vapor deposition (CVD), and may utilize a growth promotor (accelerant) along surfaces of the third material 20 and/or a growth inhibitor (poison) along surfaces of the second material 62.

The fourth material 22 comprises a different composition than the third material 20.

In the illustrated embodiment, the materials 18, 20 and 22 partially fill the cavities 66. In other embodiments, the materials may completely fill the cavities 66, or may even overfill the cavities.

Figure 9:
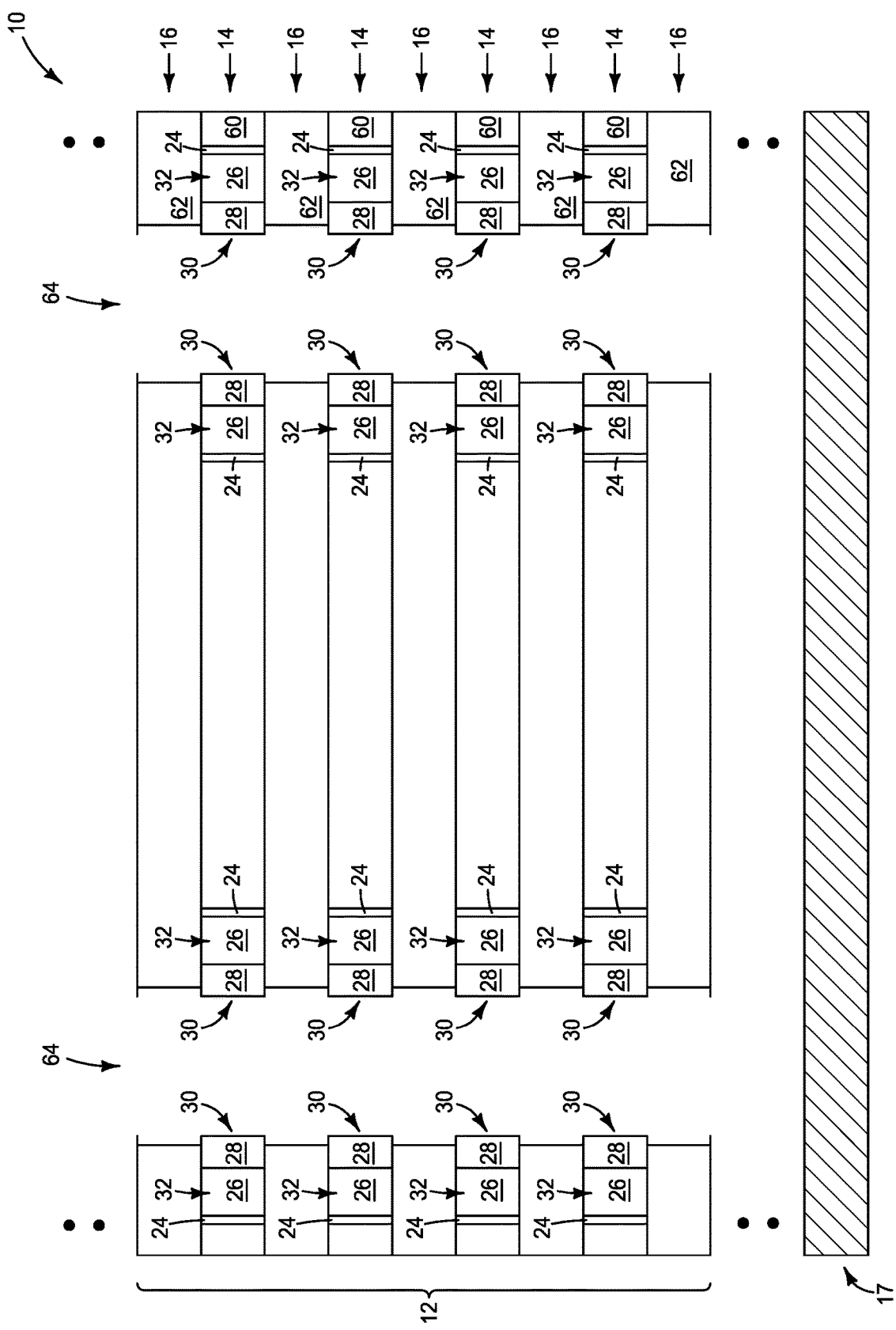

Referring to FIG. 9, the materials 18, 20 and 22 of FIG. 8 are oxidized to become materials 24, 26 and 28.

The oxidation of the material 18 is optional, and in other embodiments the material 18 may remain at the processing stage of FIG. 9 rather than being oxidized into the material 24. To the extent that the material 18 is oxidized to form the material 24, the material 24 may comprise, for example, silicon dioxide, germanium oxide, etc.

The oxidized materials 26 and 28 are high-k oxides, with the term "high-k" meaning a dielectric constant greater than that of silicon dioxide (i.e., greater than about 3.9). In some embodiments, the oxidized materials 26 and 28 may comprise, consist essentially of, or consist of one or more of AlO, HfO, ZrO, TiO, LaO, ScO and TaO, where the chemical formulas indicate primary constituents rather than specific stoichiometries.

The materials 26 and 28 are compositionally different from one another. In some embodiments, the material 28 may comprise charge-storage-material, and may be considered to be configured as charge-storage-material-segments 30 which are vertically spaced from one another. In some embodiments, the material 26 may comprise charge-blocking-material, and may be considered to be configured as charge-blocking-material-segments 32 which are vertically spaced from one another.

The high-k oxide of the charge-storage-material 28 may function as a charge-trapping-material in some embodiments.

Figure 9A:
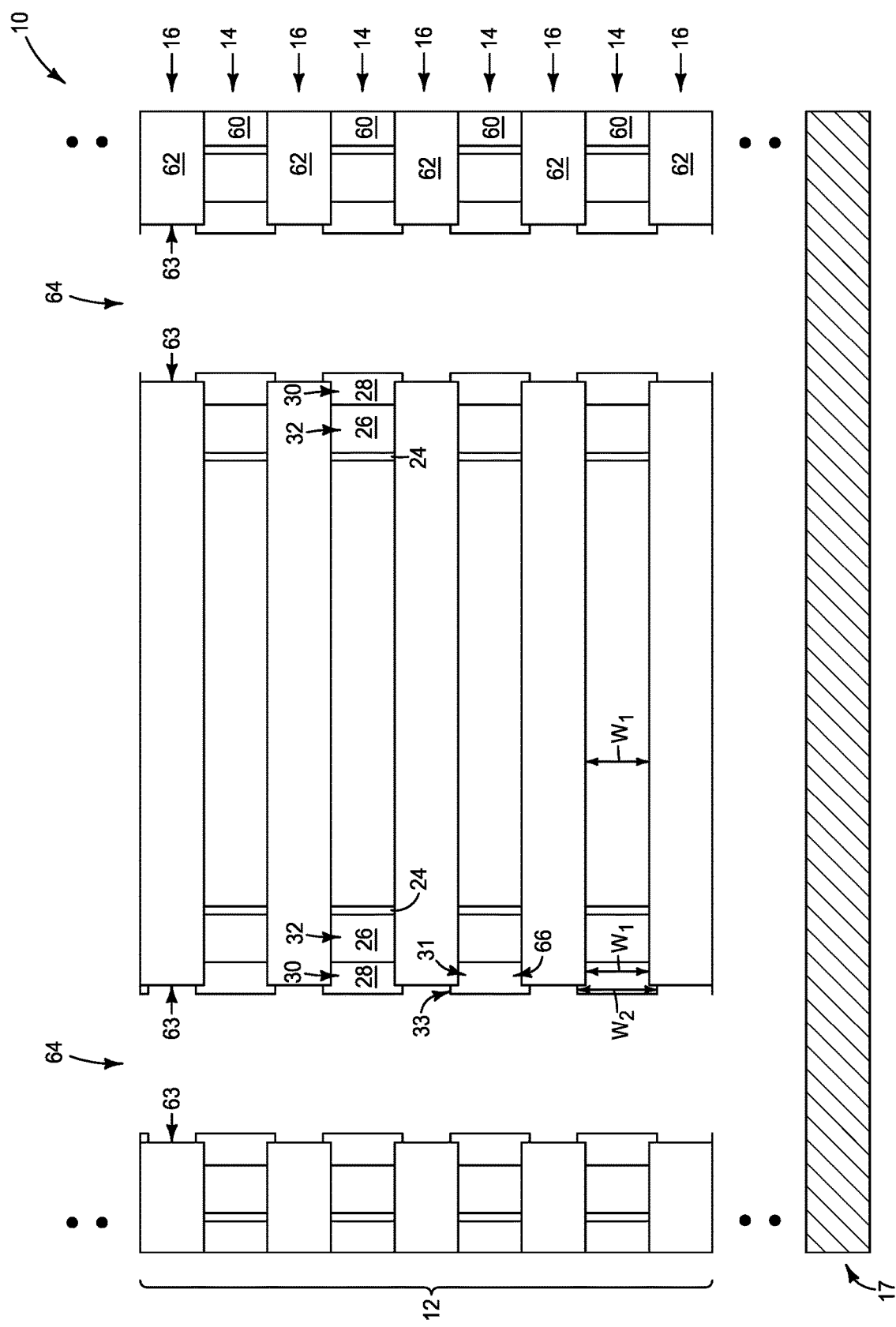
FIG. 9A is a diagrammatic cross-sectional side view of the region of the integrated assembly of FIG. 5 shown at an example process stage alternative to that of FIG. 9.

FIG. 9A shows a configuration similar to that of FIG. 9, but shows an embodiment in which the oxidation of the material 22 (FIG. 8) results in expansion of the material to form the charge-storage-material 28 to extend beyond the terminal ends 63 of the second levels 16. Accordingly, portions of the expanded material 28 extend into the opening 64. Such portions are vertically wider than the first levels 14. In the illustrated embodiment, each of the charge-storage-material-segments 30 has a first portion 31 retained within a cavity 66, and has a second portion 33 that extends outwardly of the cavity and into the opening 64. The first portion 31 has a first vertical width $W_1$ (i.e., a first vertical dimension) which is about the same as the vertical width of an associated level 14, and the second portion 33 has a second vertical width $W_2$ (i.e., a second vertical dimension) which is larger than the first vertical width $W_1$. In some embodiments, the second vertical width $W_2$ may be at least about 5% larger than the first vertical width $W_1$, at least about 10% larger than the first vertical width, at least about 15% larger than the first vertical width, at least about 20% larger than the first vertical width, etc.

Figure 10:
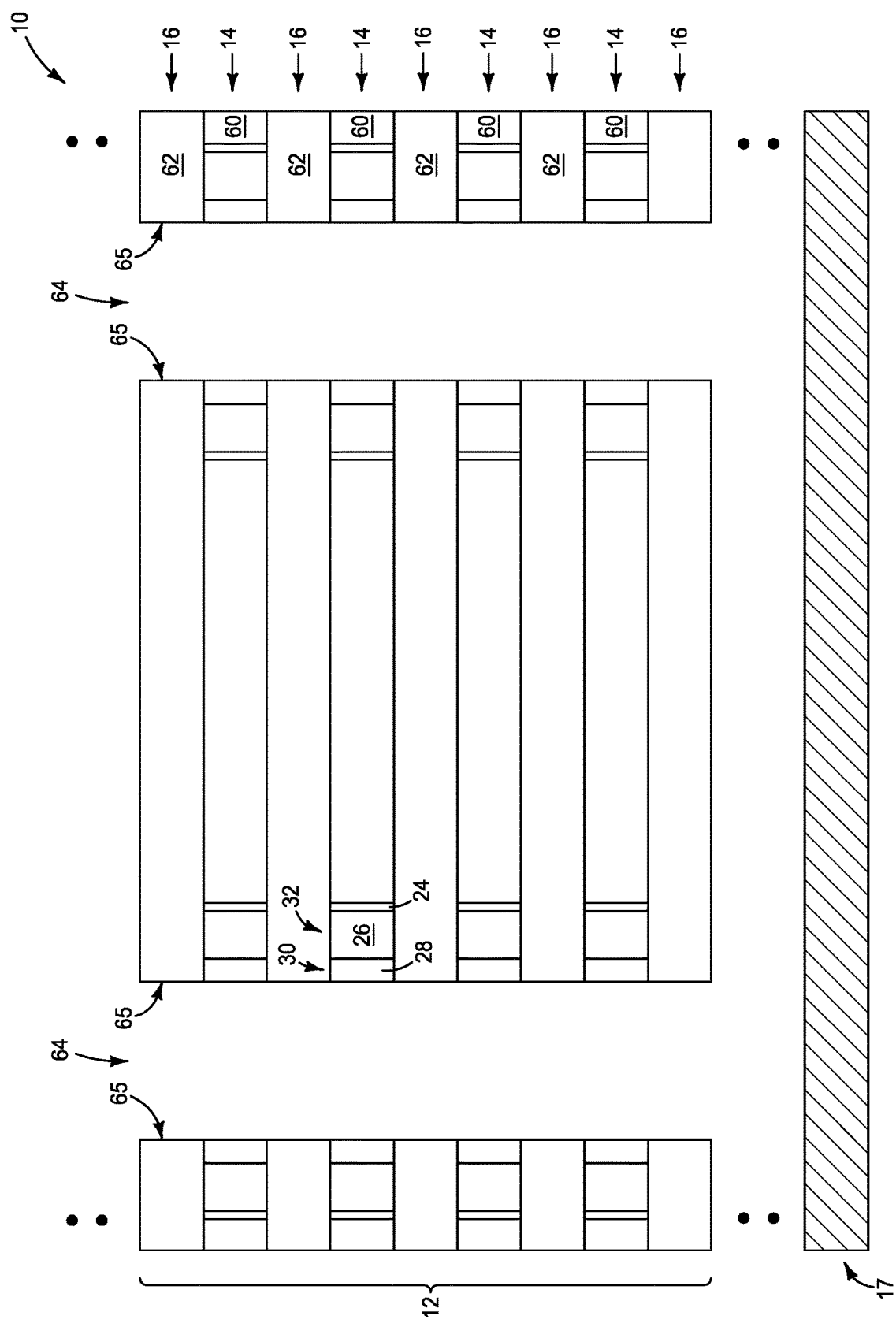
FIGS. 10 and 11 are diagrammatic cross-sectional side views of the region of the integrated assembly of FIG. 5 shown at example sequential process stages which may follow the process stage of FIG. 9.

Referring to FIG. 10, an optional process stage after FIG. 9 may be to reestablish the straight sidewalls 65 of the openings 64 with one or more suitable etches.

Figure 11:
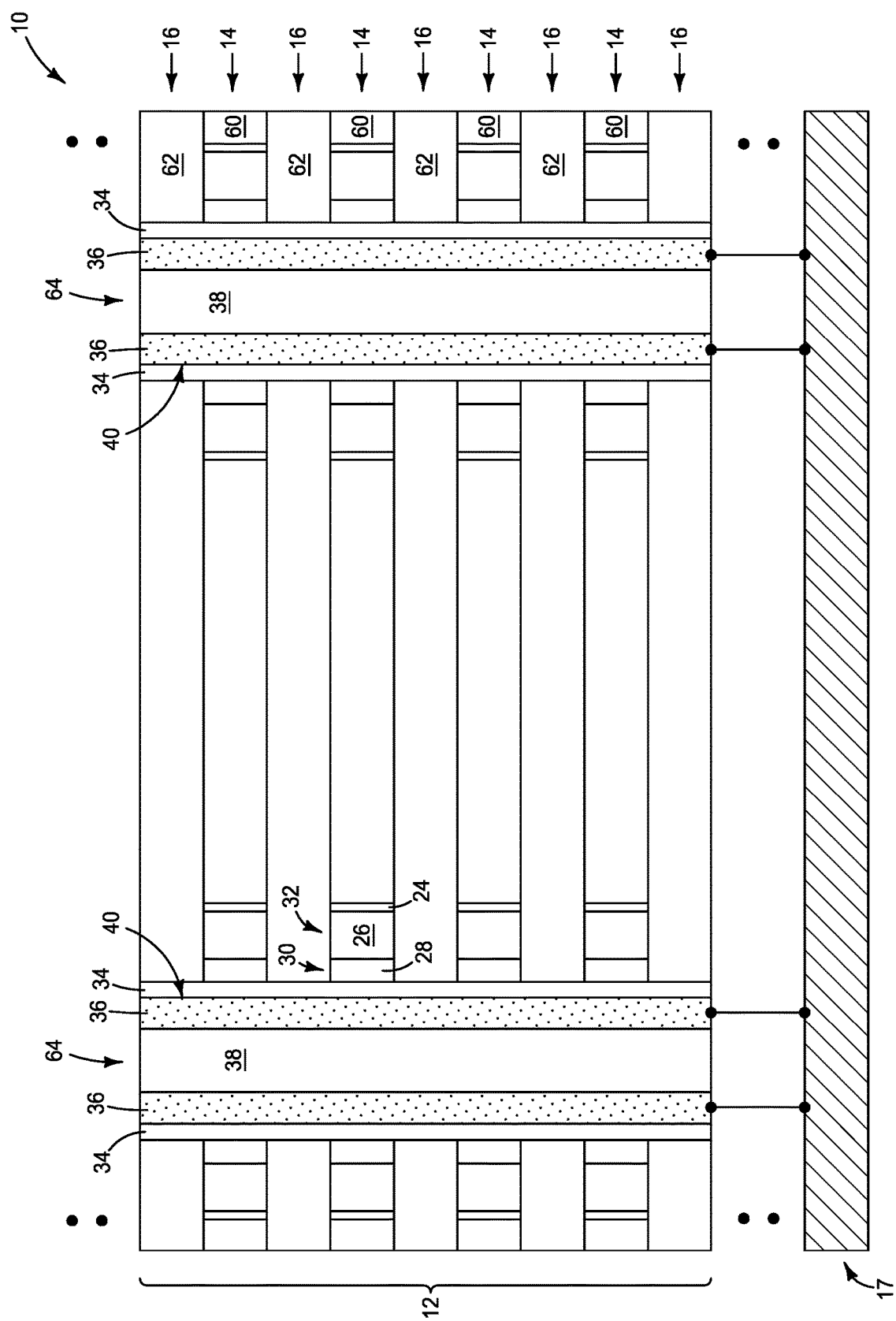

Referring to FIG. 11, cell materials (memory cell materials) 34 and 36 are formed within the openings 64.

The material 34 is gate-dielectric-material (i.e., tunneling material, charge-passage-material). The gate-dielectric-material 34 may comprise any suitable composition(s). In some embodiments, the gate-dielectric-material 34 may comprise, for example, one or more of silicon dioxide, silicon nitride, silicon oxynitride, aluminum oxide, hafnium oxide, zirconium oxide, etc. The gate-dielectric-material 34 may be bandgap-engineered to achieve desired electrical properties, and accordingly may comprise a combination of two or more different materials. For instance, the material 34 may comprise ONO (where ONO may be understood to refer to a laminate comprising $SiO_2/Si_3N_4/SiO_2$).

The gate-dielectric-material 34 is directly adjacent to the charge-storage-material-segments 30 along the first levels 14.

The material 36 is channel material. The channel material 36 is directly adjacent to the tunneling material 34.

The channel material 36 comprises semiconductor material, and may comprise any suitable composition or combination of compositions. For instance, the channel material 36 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 36 may comprise, consist essentially of, or consist of silicon. The channel material 36 is shown with stippling to assist the reader in identifying the channel material.

In the illustrated embodiment, insulative material 38 is formed adjacent to the channel material 36, and fills central regions of the openings 64. The insulative material 38 may comprise any suitable composition(s); and in some embodiments may comprise, consist essentially of, or consist of silicon dioxide. The illustrated embodiment of FIG. 11 shows the channel material 36 configured as an annular ring which surrounds the insulative material 38. Such configuration of the channel material may be considered to comprise a hollow channel configuration, in that the insulative material 38 is provided within a "hollow" in the annular-ring-shaped channel configuration. In other embodiments (not shown), the channel material may be configured as a solid pillar configuration.

The channel material 36 is shown to be electrically coupled with the source structure 17 in the cross-sectional view of FIG. 11. Such electrical coupling may be accomplished with any suitable configuration. For instance, in some embodiments the channel material 36 may directly contact the source structure 17.

The channel material 36 may be considered to be configured as channel-material-pillars 40 which extend vertically through the stack 12. The illustrated openings 64 may be considered to be representative of a large number of substantially identical openings that may be present at the processing stage of FIG. 11, and the illustrated channel-material-pillars 40 may be considered to be representative of a large number of substantially identical channel-material-pillars that may be formed at the processing stage of FIG. 11. For instance, in some embodiments there may be hundreds, thousands, hundreds of thousands, millions, hundreds of millions, etc., of the channel-material-pillars formed at the processing stage of FIG. 11.

The lateral thicknesses of the materials 24, 26, 28, 34, 36 and 38 of FIG. 11 are for illustrative purposes only. In practice, the relative lateral thicknesses of the materials 24, 26, 28, 34, 36 and 38 may be different than shown.

Figure 11A:
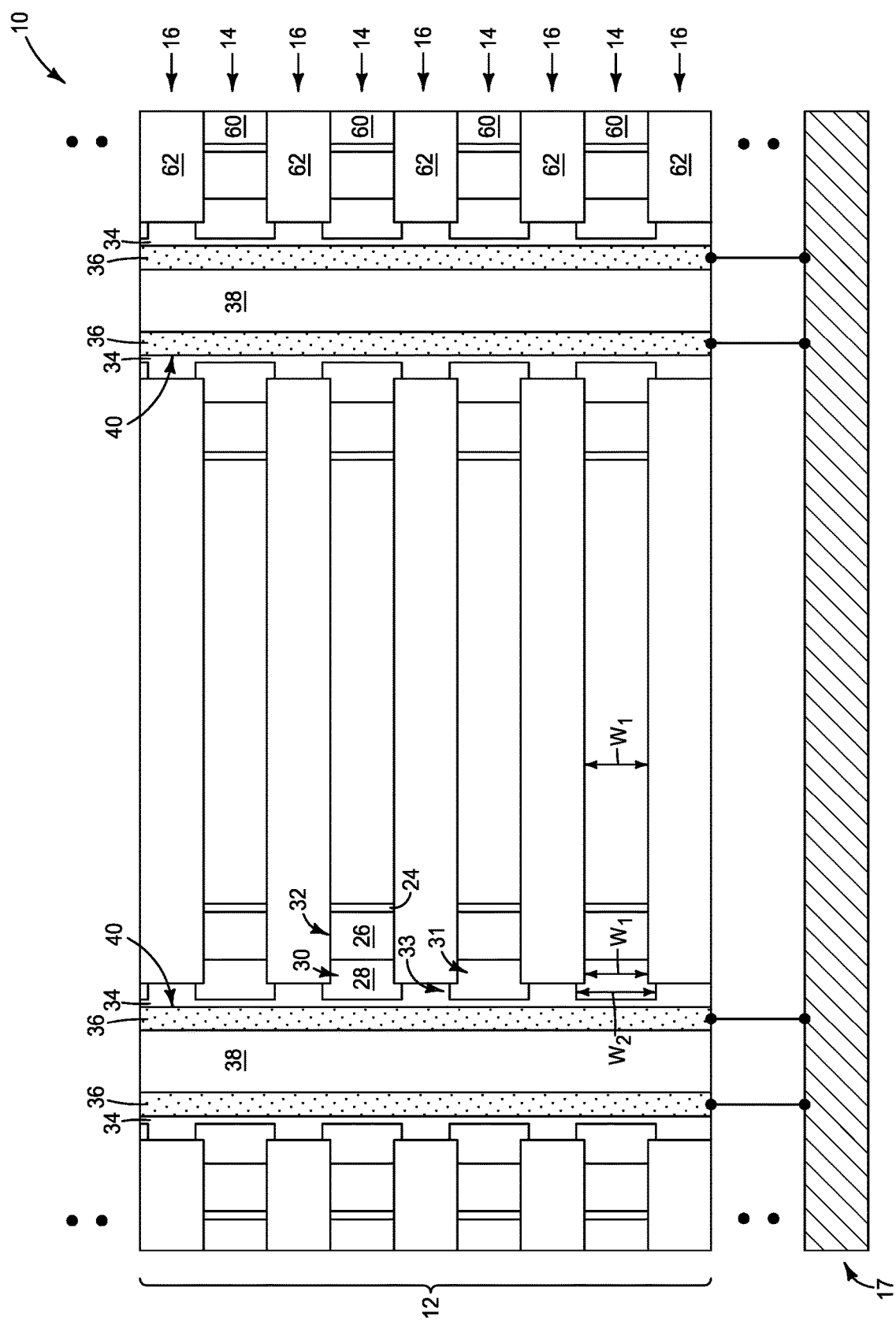
FIG. 11A is a diagrammatic cross-sectional side view of the region of the integrated assembly of FIG. 5 shown at an example process stage alternative to that of FIG. 11.

FIG. 11A shows a configuration similar to that of FIG. 11, but following the process stage of FIG. 9A. The tunneling material (gate-dielectric-material) 34 of the configuration of FIG. 11A extends around the wide portions 33 of the charge-storage-material-segments 30.

Figure 12:
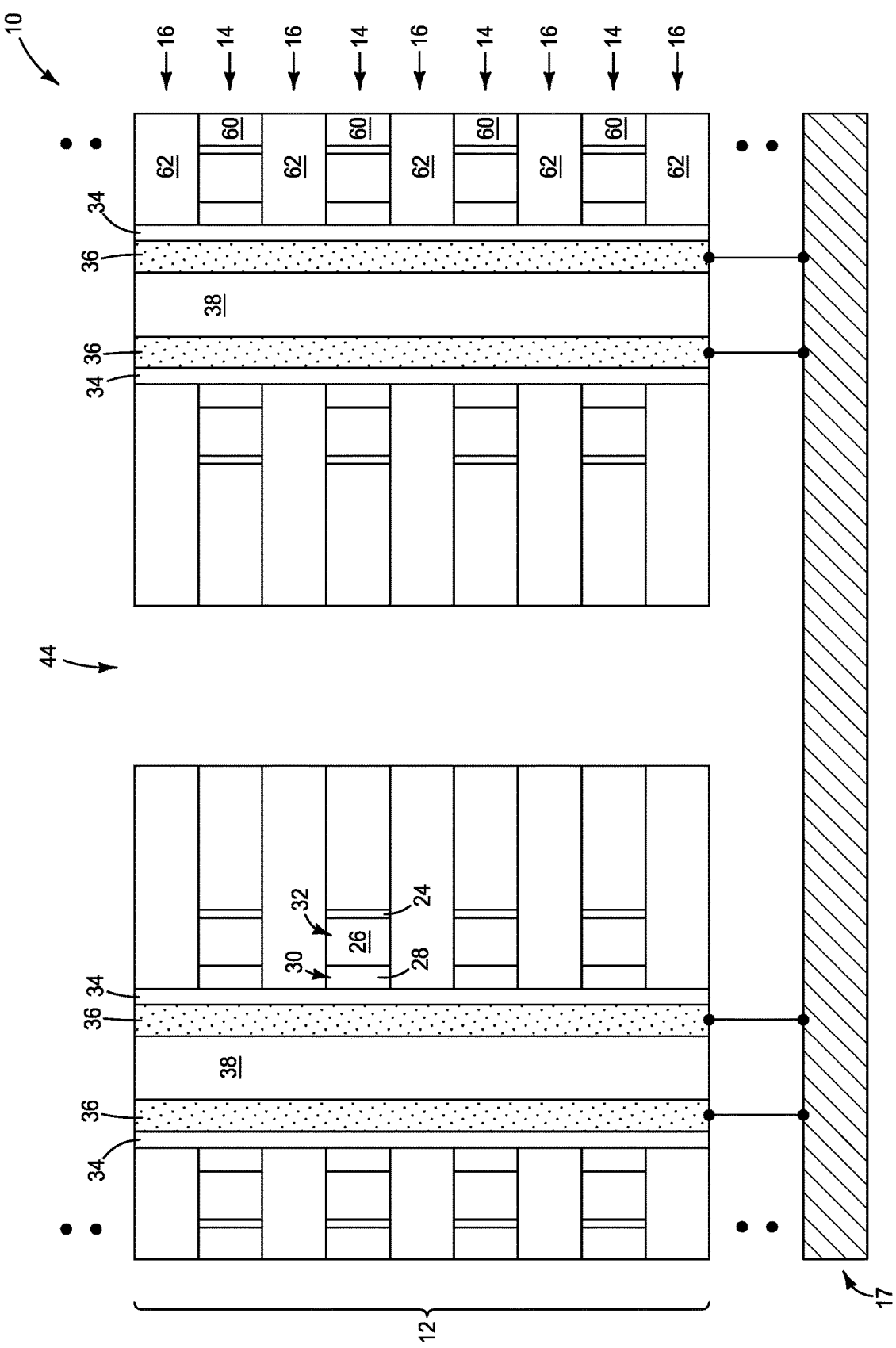
FIGS. 12-14 are diagrammatic cross-sectional side views of the region of the integrated assembly of FIG. 5 shown at example sequential process stages which may follow the process stage of FIG. 11.

Referring to FIG. 12, a slit 44 is formed to extend through the stack 12. The illustrated slit 44 may be representative of a large number of substantially identical slits formed at the process stage of FIG. 12.

Figure 13:
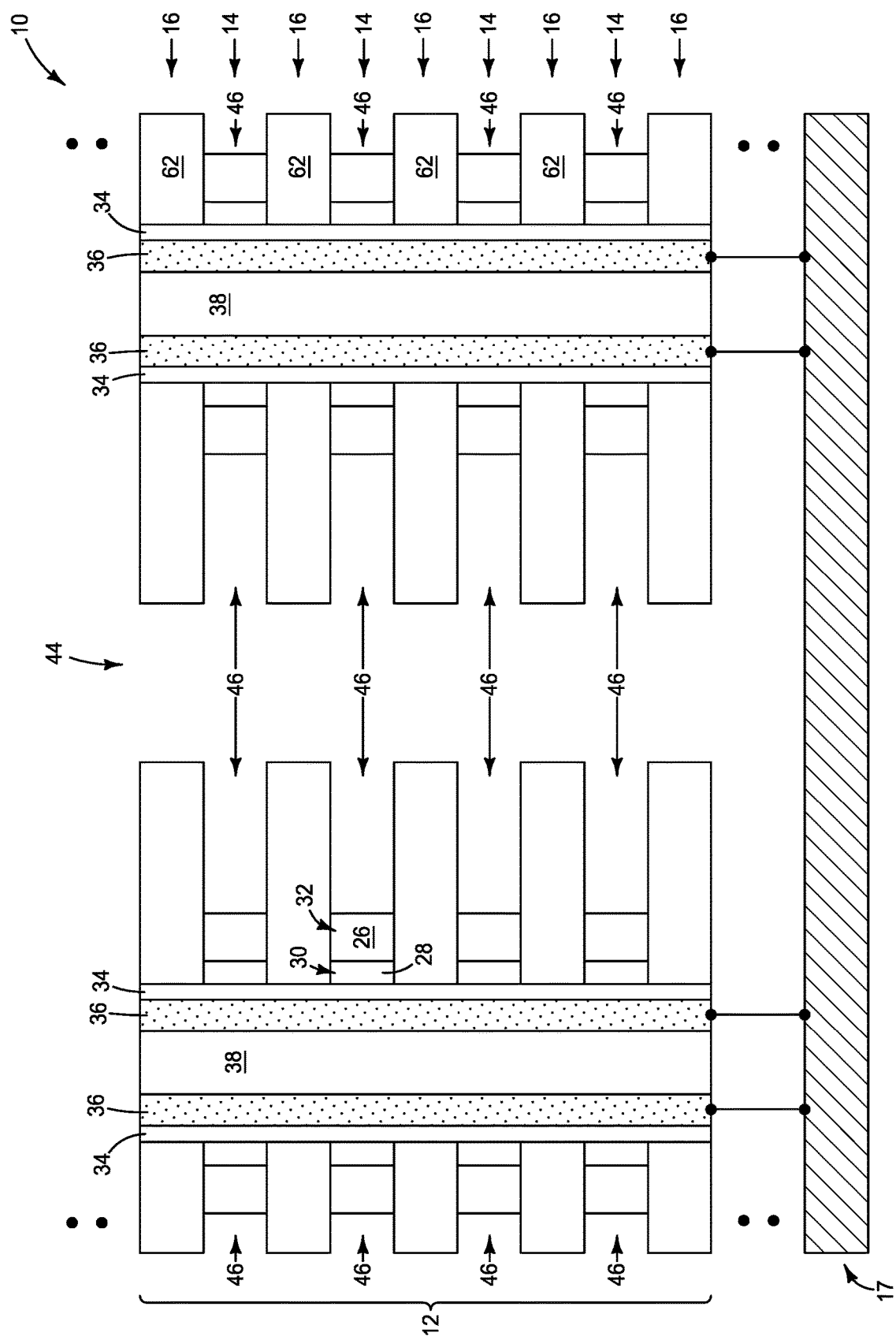

Referring to FIG. 13, the first material 60 (FIG. 12) is removed, which leaves conduits (voids) 46 along the first levels 14 (i.e., between the second levels 16). The conduits 46 may be formed with any suitable process. In some embodiments such process may utilize etchant (e.g., hot phosphoric acid) flowed into the slit 44.

In the shown embodiment, the conduits are extended through the oxidized-spacer-material 24 (FIG. 12), or in other words, the oxidized-spacer-material is removed during the formation of the conduits. In other embodiments, the oxidized-spacer-material 24 may not be removed, and instead may remain at the processing stage of FIG. 13 after the formation of the conduits 46. In yet other embodiments, the spacer material 18 (FIG. 8) may not be oxidized, and may be either removed during the formation of the conduits 46 or may remain at the processing stage of FIG. 13 after the formation of the conduits.

Figure 14:
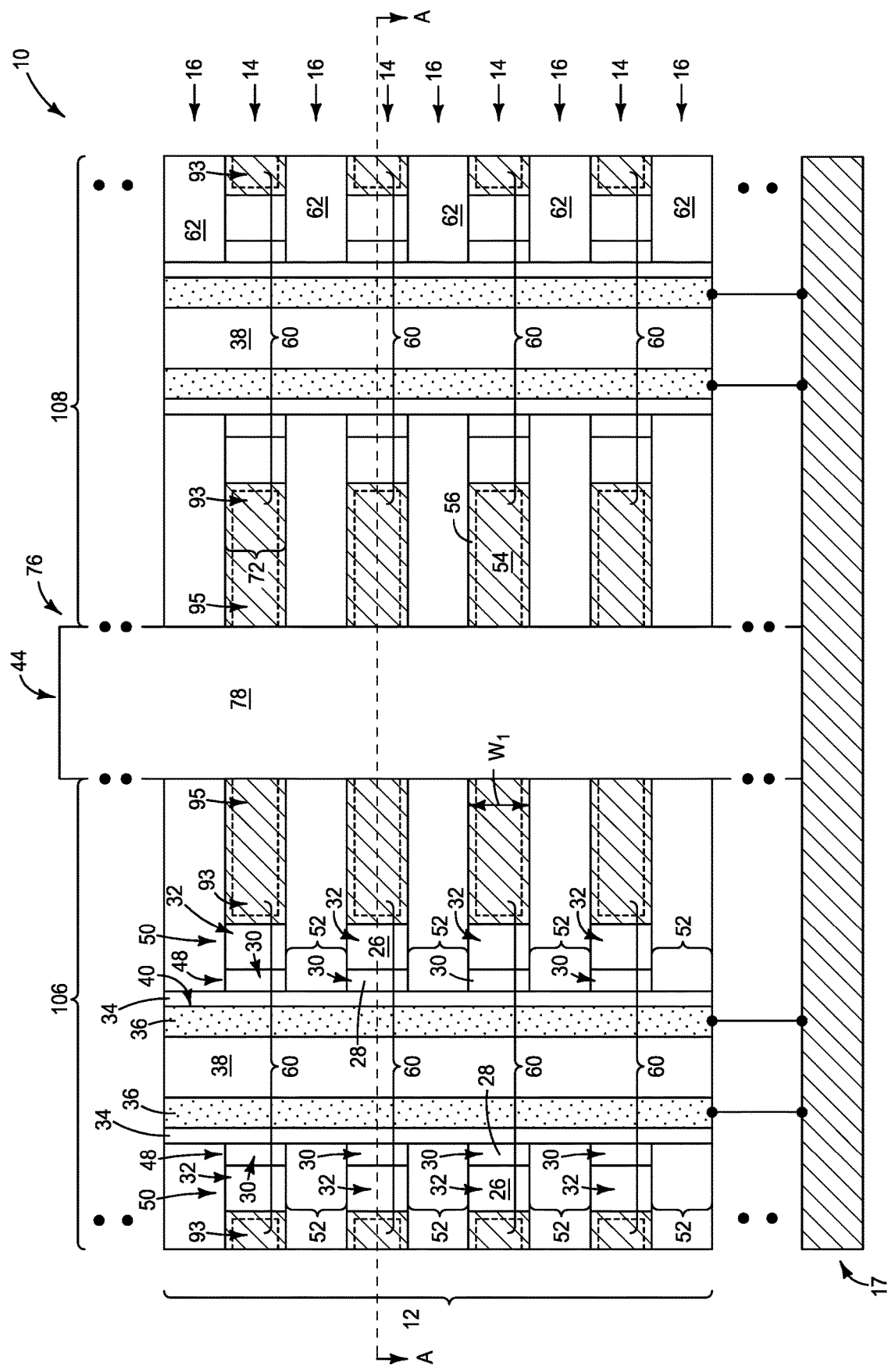
Figure 14A:
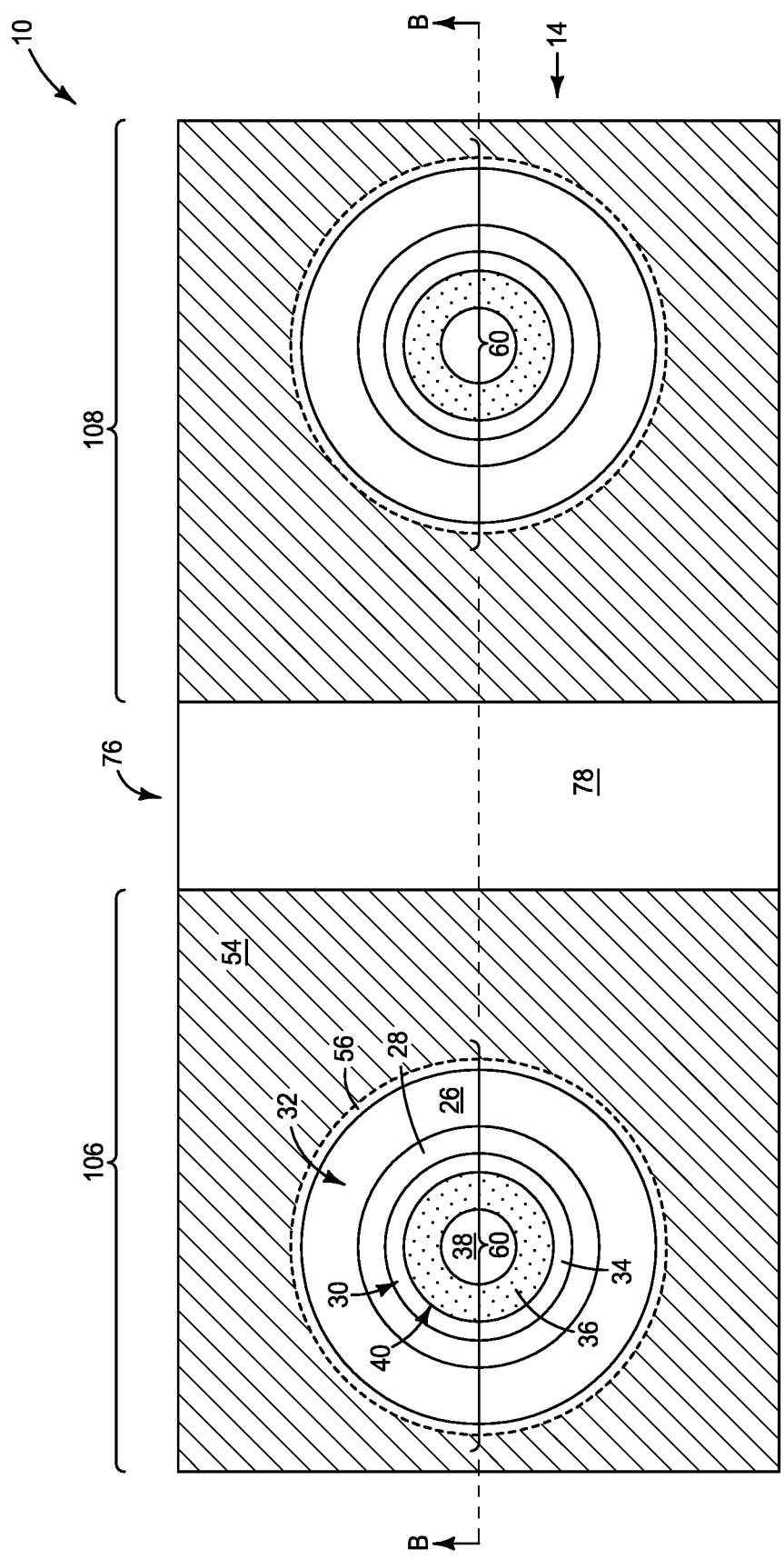
FIG. 14A is a diagrammatic sectional top-down view of the assembly of FIG. 14. The view of FIG. 14 is along the line B-B of FIG. 14A, and the view of FIG. 14A is along the line A-A of FIG. 14.

Referring to FIGS. 14 and 14A, the voids 46 (FIG. 13) are filled with conductive material 72. Accordingly, the stack 12 becomes a stack of alternating conductive levels 14 and insulative levels 16.

The conductive material 72 of the conductive levels 14 may comprise a single homogeneous composition, or may comprise a laminate of two or more different compositions. In the illustrated embodiment, dashed lines are provided within the conductive material 72 to indicate that the material 72 may comprise a conductive-core-material 54, and a conductive-liner-material 56 along an outer periphery (outer peripheral surface) of the conductive-core-material. The conductive-liner-material 56 may at least partially surround the outer periphery of the conductive-core-material 54.

The conductive-core-material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive-core-material 54 may comprise one or more metals (e.g., may comprise tungsten).

The conductive-liner-material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, conductive-liner-material 56 may comprise one or more metal nitrides (e.g., may comprise titanium nitride, tungsten nitride, etc.).

In some embodiments, the conductive material 72 may comprise one or more of tungsten, tantalum, molybdenum, tantalum nitride and titanium nitride; and may be a homogenous composition, or may comprise a laminate of two or more different compositions.

The conductive levels 14 may be considered to be memory cell levels (also referred to herein as wordline levels) of a NAND configuration. The NAND configuration includes strings of memory cells 60 (i.e., NAND strings), with the number of memory cells 60 in the strings being determined by the number of vertically-stacked levels 14. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The illustrated NAND strings may be representative of a large number of substantially identical NAND strings formed during fabrication of a NAND memory array (with the term "substantially identical" meaning identical to within reasonable tolerances of fabrication and measurement).

The NAND memory cells 60 comprise the charge-blocking-material 26, the charge-storage-material 28, the tunneling material 34 and the channel material 36.

The conductive levels 16 have terminal regions (proximal regions) 93 proximate the channel-material-pillars 40, with such terminal regions being laterally offset from the channel-material-pillars by intervening regions comprising the materials 26, 28 and 34. The conductive levels also have distal regions 95 further from the channel-material-pillars 40 than the terminal regions 93. In some embodiments, the terminal regions may be considered to correspond to control gate regions (or control gates) of the memory cells 60, and the distal regions 95 may be considered to correspond to wordline regions (routing regions) which couple the control gate circuitry with other circuitry (e.g., driver circuitry). The control gate regions 93 may comprise control gates analogous to those described above with reference to FIGS. 1-4.

A panel 76 is formed within the slit 44 after the formation of the conductive material 72 within the conduits 46 (FIG. 13). The panel comprises panel material 78. The panel material 78 may comprise any suitable composition(s), and in some embodiments may comprise, consist essentially of, or consist of silicon dioxide. Although the panel 76 is shown to comprise a single homogeneous material, in other embodiments the panel may comprise a laminate of two or more different materials.

The panel 76 may divide the pillars 40 between a first block region 106 and a second block region 108. Each of the pillars 40 may be considered to be associated with a vertical stack of memory cells (e.g., NAND memory cells) 60. Accordingly, the memory cells 60 on one side of the panel 76 may be considered to be within the first block region (memory-block-region) 106, and the memory cells 60 on the other side of the panel 76 may be considered to be within the second block region (memory-block-region) 108. The block regions 106 and 108 may be analogous to the memory blocks (or memory sub-blocks) described above in the "Background" section of this disclosure.

In operation, the charge-storage material 28 may be configured to store information in the memory cells 60. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 93, and/or based on the value of voltage applied to the channel material 36.

The tunneling material 34 forms tunneling regions of the memory cells 60. Such tunneling regions may be configured to allow desired migration (e.g., transportation) of charge (e.g., electrons) between the charge-storage material 28 and the channel material 36. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking-material 26 may provide a mechanism to block charge from flowing between the charge-storage-material 28 and the associated gates 93.

The charge-storage-material-segments 30 of FIG. 14 may be considered to be arranged in first vertically-stacked configurations 48, and the charge-blocking-material-segments may be considered to be arranged in a second vertically-stacked configurations 50.

The vertically-stacked configurations 48 comprise the charge-storage-material-segments 30 alternating with insulative regions 52, and the vertically-stacked configurations 50 comprise the charge-blocking-material segments 32 alternating with the insulative regions 52. In the illustrated embodiment of FIG. 14, the insulative regions 52 comprise the material 62 of the second levels 16. Accordingly, in some embodiments the insulative regions 52 may comprise, consist essentially of, or consist of silicon dioxide.

Figure 14B:
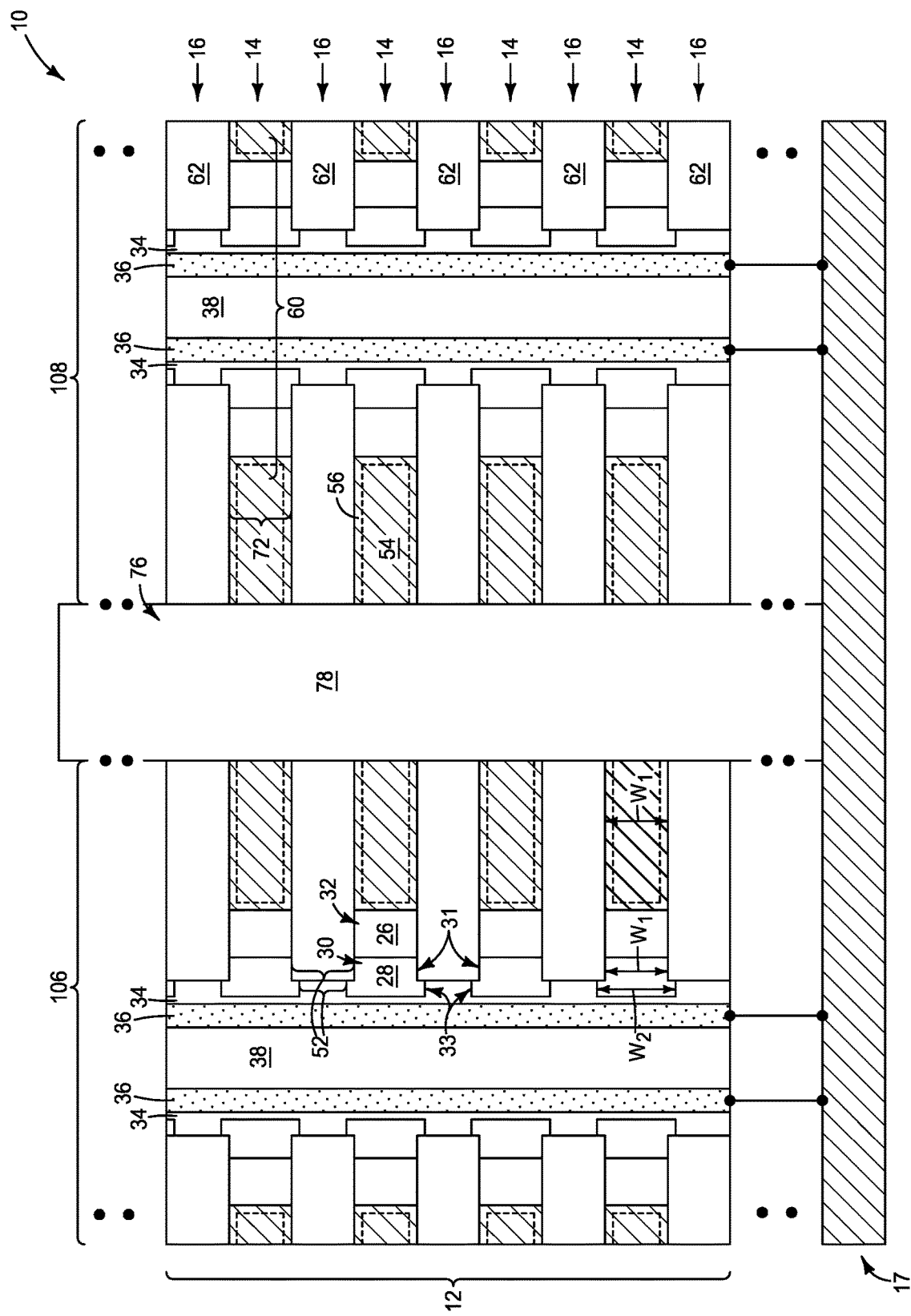
FIG. 14B is a diagrammatic cross-sectional side view of the region of the integrated assembly of FIG. 5 shown at an example process stage alternative to that of FIG. 14.

In the embodiment of FIG. 14, the conductive levels 14, the charge-blocking-material-segments 32 and the charge-storage-material-segments 30 all have about the same vertical width ($W_1$) as one another. FIG. 14B shows an embodiment similar to that of FIG. 14, but following the process stage of FIG. 11A. Accordingly, the embodiment of FIG. 14B shows the charge-storage-material-segments 30 to have the portions 33 which are vertically wider than the conductive levels 14. Specifically, the charge-storage-material-segments 30 have the second vertical width $W_2$, and the conductive levels 14 have the first vertical width $W_1$, where the second vertical width $W_2$ is greater than the first vertical width $W_1$.

The embodiment of FIG. 14B has the insulative regions 52 comprising the tunneling material 34 between the wide portions 33 of the vertically-stacked charge-storage-material-segments 30, and comprising the material 62 between the narrower regions 31 of the vertically-stacked charge-storage-material-segments 30 (as well as between the vertically-stacked charge-blocking-material-segments 32). In some embodiments, the materials 34 and 62 may comprise a same composition as one another (e.g., both may comprise, consist essentially of, or consist of silicon dioxide). In other embodiments, the material 34 may comprise a different composition than the material 62 (e.g., the material 34 may be a bandgap-engineered-material comprising a laminate of two or more different compositions, while the material 62 homogeneously comprises silicon dioxide).

Figure 15:
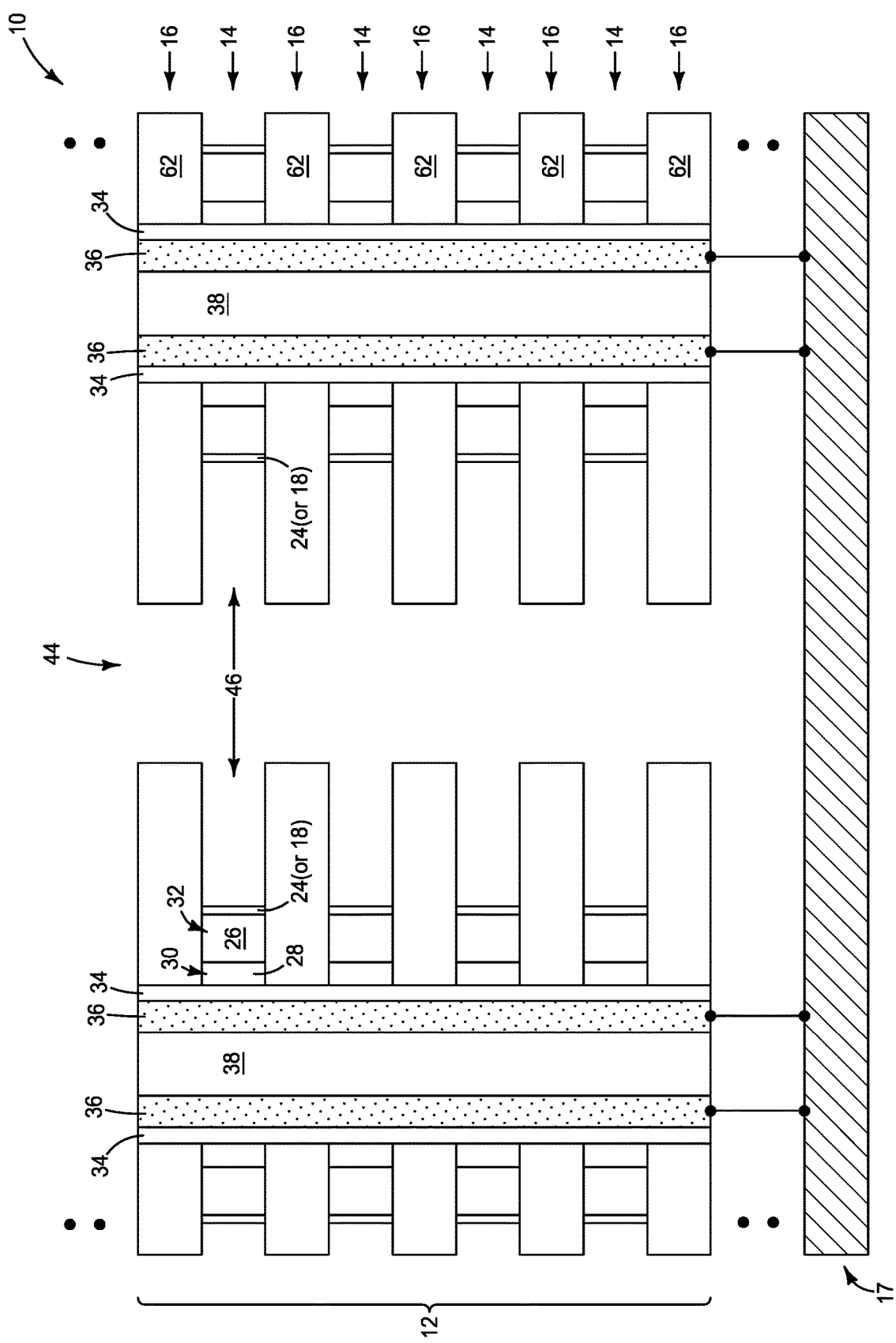
FIGS. 15 and 16 are diagrammatic cross-sectional side views of the region of the integrated assembly of FIG. 5 shown at example sequential process stages which may follow the process stage of FIG. 12.

FIG. 15 shows an example embodiment at a process stage following the process stage of FIG. 12, and alternative to that of FIG. 13, with the material 24 remaining after the formation of the conduits 46. Alternatively, the material 18 may remain after the formation of the conduits 46 if such material is not oxidized to form the material 24.

Figure 16:
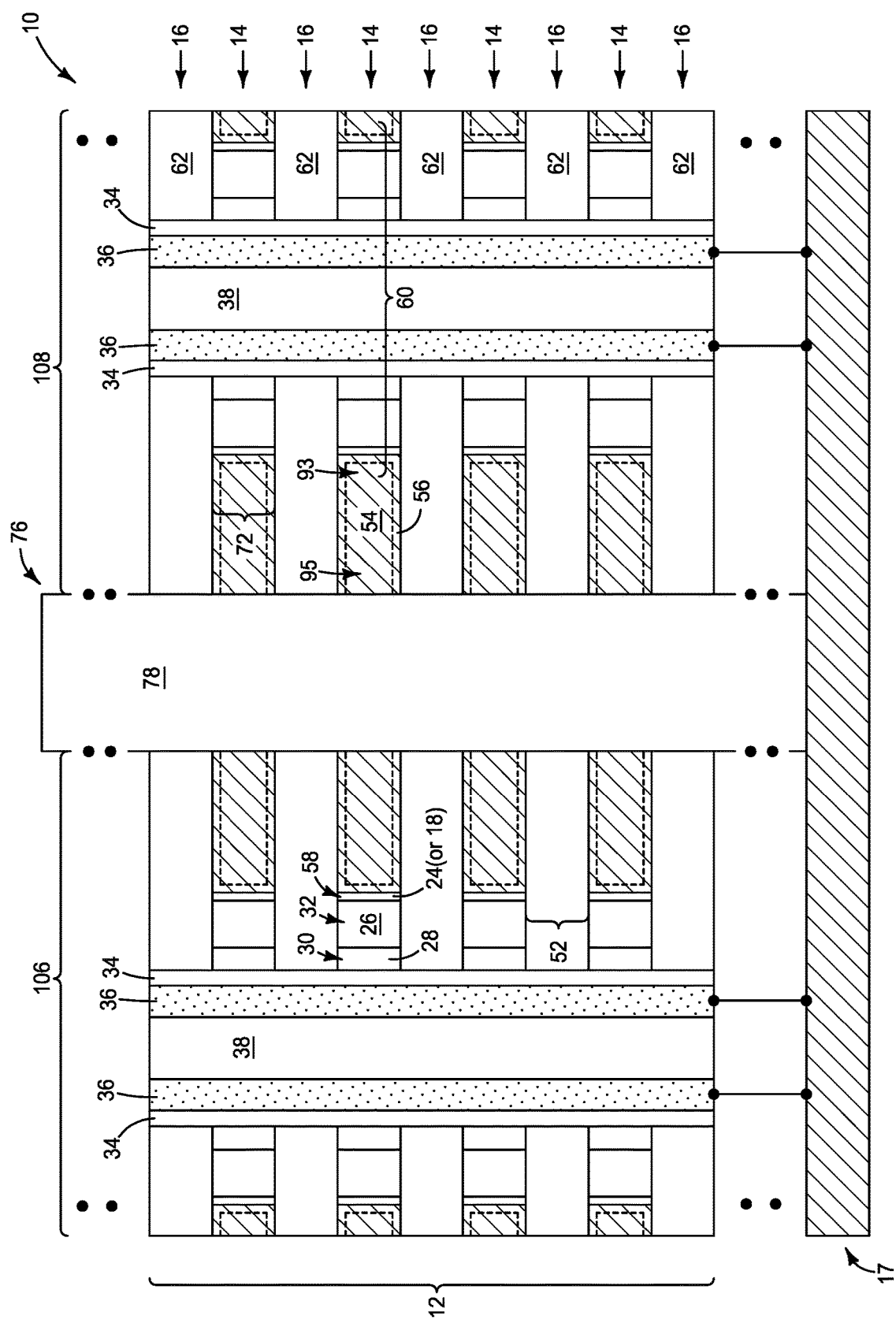

FIG. 16 shows the embodiment of FIG. 15 after formation of the conductive material 72 within the conduits 46 (FIG. 15), and the formation of the panel 76 within the slit 44 (FIG. 15). The material 24 (or 18) forms spacers 58 between the conductive material 72 of the conductive levels 14 and the charge-blocking-material-segments 32 (and in the shown embodiment between the conductive-liner-material 56 and the charge-blocking-material 26). The spacers 58 may be insulative, and accordingly the material 24 (or 18) may be referred to as insulative-spacer-material. Alternatively, the spacers 58 may be conductive or semiconductive, particularly if the material 18 is not oxidized. In such embodiments, the spacers 58 may be considered to comprise conductive-spacer-material or to comprise semiconductive-spacer-material.

Figure 17:
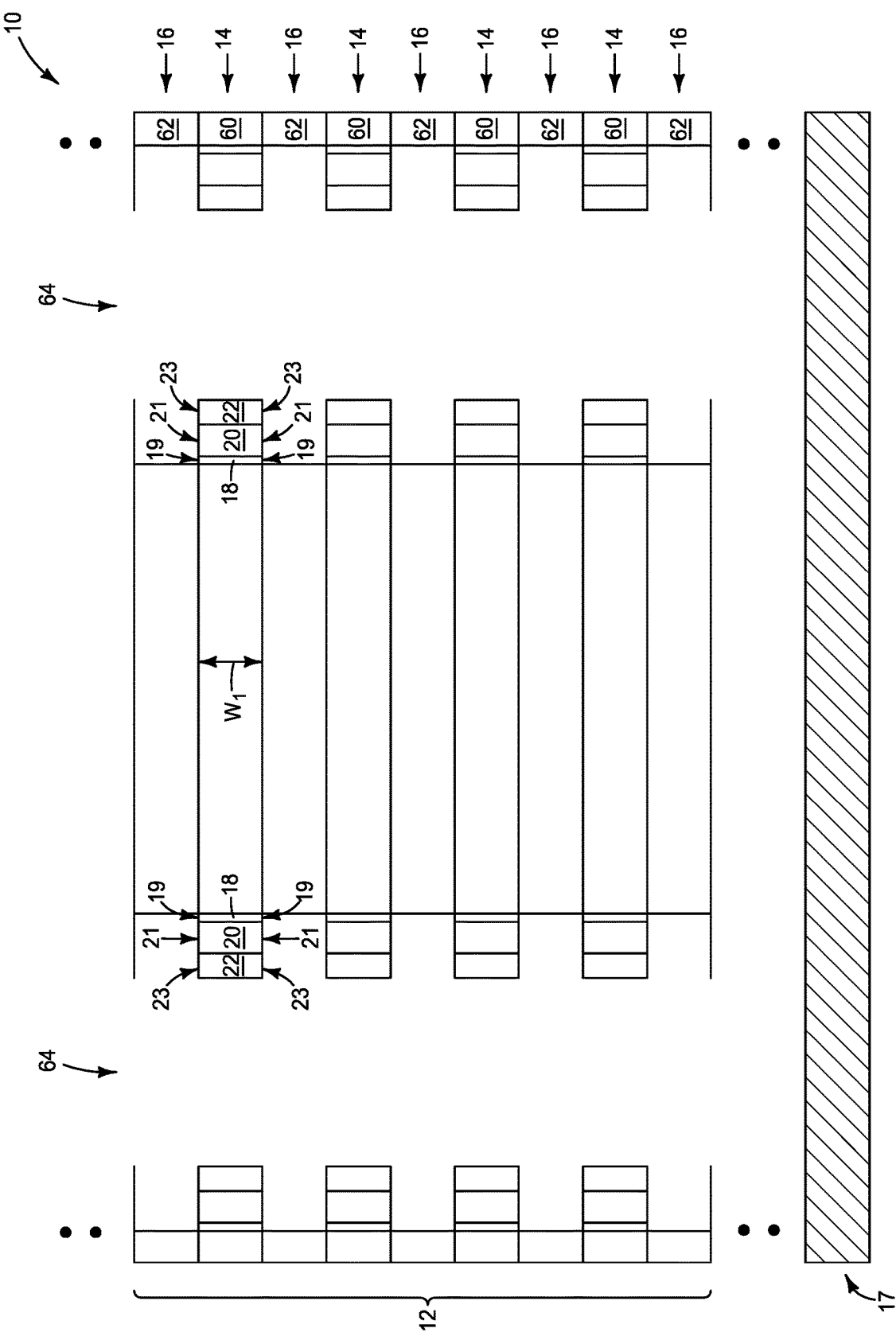
FIGS. 17-19 are diagrammatic cross-sectional side views of the region of the integrated assembly of FIG. 5 shown at example sequential process stages which may follow the process stage of FIG. 8.

FIG. 17 shows an example embodiment at a process stage following the process stage of FIG. 8, and alternative to that of FIG. 9, with the material 62 of the second levels 16 being recessed after forming the materials 18, 20 and 22. The recessing of the second levels 16 exposes surfaces 19, 21 and 23 of the materials 18, 20 and 22, respectively. In some embodiments, the processing of FIG. 17 may be considered to comprise recessing the second levels 16 relative to the third and fourth materials 20 and 22 (and in the shown embodiment relative to the spacer material 18).

Figure 18:
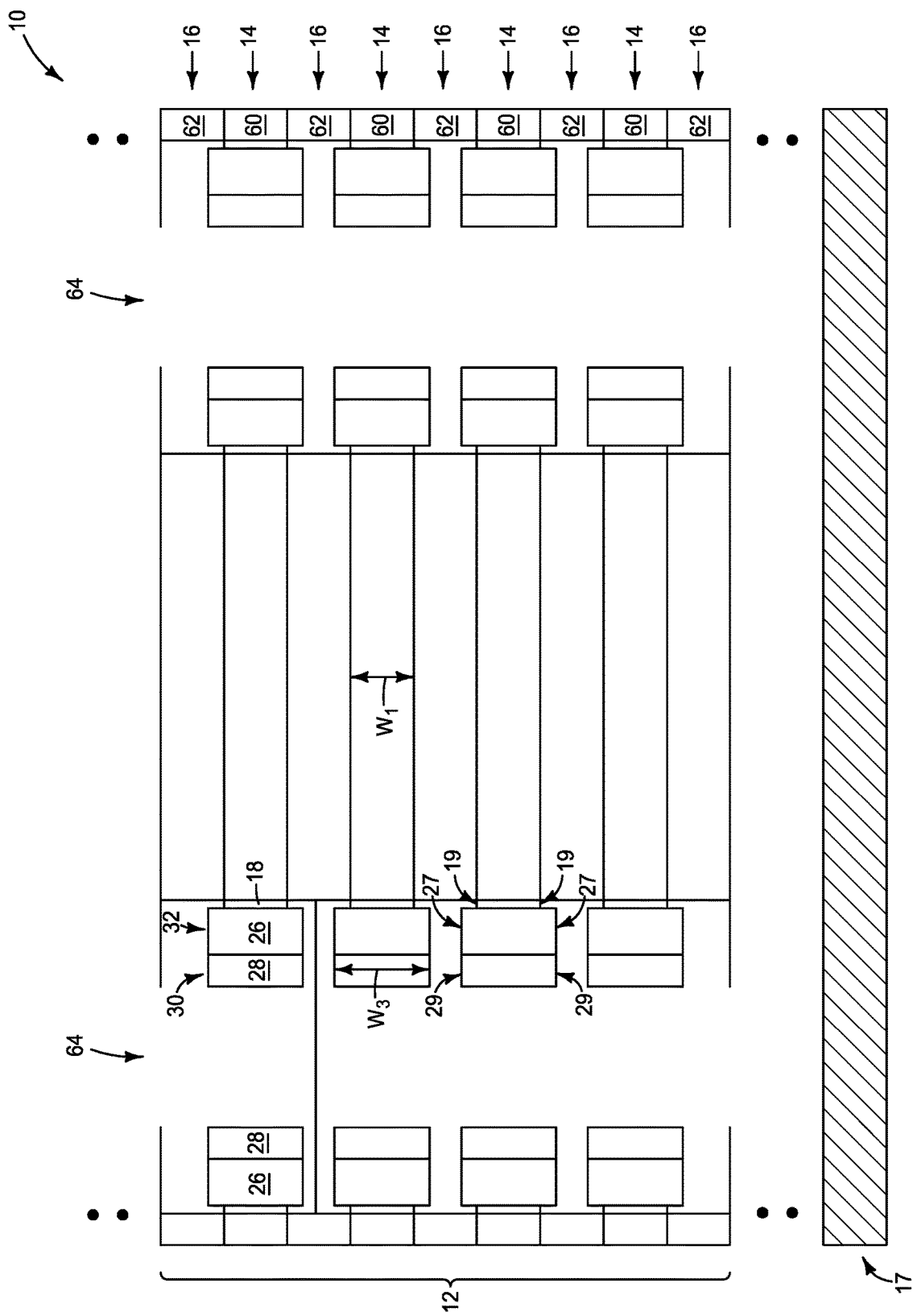

Referring to FIG. 18, the materials 18, 20 and 22 are exposed to oxidative conditions by flowing suitable oxidant (e.g., $H_2O_2$, $O_3$, etc.) within the opening 64. In the illustrate embodiment, the materials 20 and 22 oxidize to form the charge-blocking-material 26 and the charge-storage-material 28, respectively. The material 18 is shown to not be oxidized in the embodiment of FIG. 18, but in other embodiments may oxidize analogously to the oxidation described above with reference to FIG. 9.

The charge-storage-material 28 is configured as vertically-stacked charge-storage-material-segments 30, and the charge-blocking-material 26 is configured as vertically-stacked charge-blocking-material-segments 32. The oxidized materials 26 and 28 of FIG. 18 are vertically-expanded relative to the non-oxidized materials 20 and 22 of FIG. 17. Specifically, the non-oxidized materials 20 and 22 of FIG. 17 had vertical widths (i.e., vertical dimensions) about the same as the vertical widths $W_1$ of the first levels 14, whereas the oxidized materials 26 and 28 of FIG. 18 have vertical widths $W_3$ substantially larger than the vertical widths $W_1$. In some embodiments, the vertical widths $W_3$ may be at least about 5% larger than the vertical widths $W_1$, at least about 10% larger than the vertical widths $W_1$, at least about 20% larger than the vertical widths $W_1$, etc.

Although the segments 30 and 32 are shown to have the same vertical widths $W_3$ as one another, in other embodiments the segments 30 may have different vertical widths than the segments 32.

The materials 26 and 28 have exposed surfaces 27 and 29 at the processing stage of FIG. 18, and the material 18 has the exposed surfaces 19.

Figure 19:
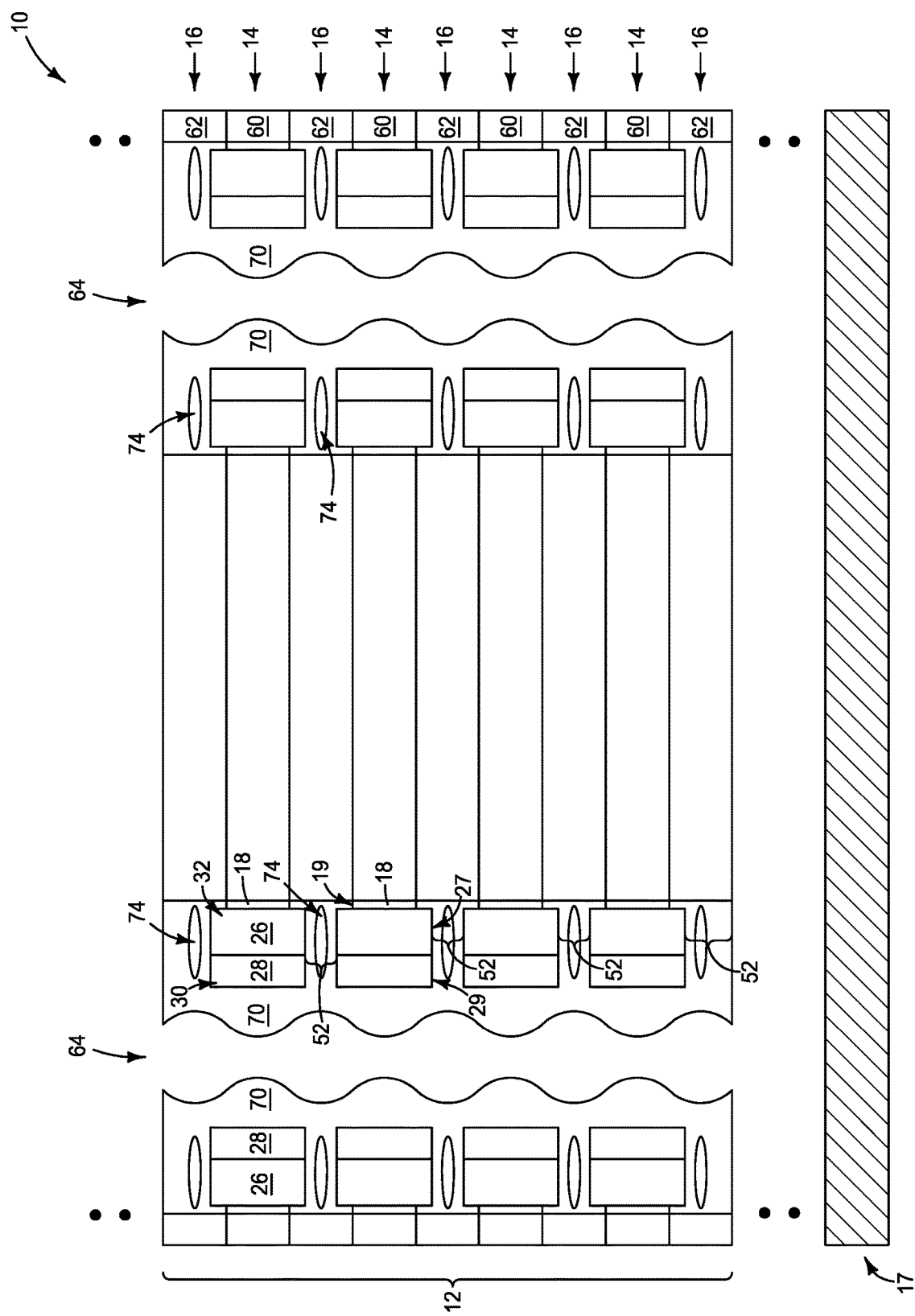

Referring to FIG. 19, insulative material 70 is formed within the openings 64. The insulative material 70 wraps around the exposed surfaces 19, 27 and 29 of the materials 18, 26 and 28. The insulative material 70 may comprise any suitable composition(s). In some embodiments, the insulative material 70 may comprise, consist essentially of, or consist of silicon dioxide. In some embodiments, at least portions of the insulative material 70 may be incorporated into tunneling material. Such portions may comprise silicon dioxide, either alone or in a bandgap-engineered laminate.

In the shown embodiment, the insulative material 70 only partially fills regions 52 between vertically-adjacent of the charge-storage-material-segments 30 to leave voids 74 directly between such vertically-adjacent segments. Also, in the shown embodiment the voids 74 extend laterally to also be directly between vertically-adjacent of the charge-blocking-material-segments 32.

Figure 19A:
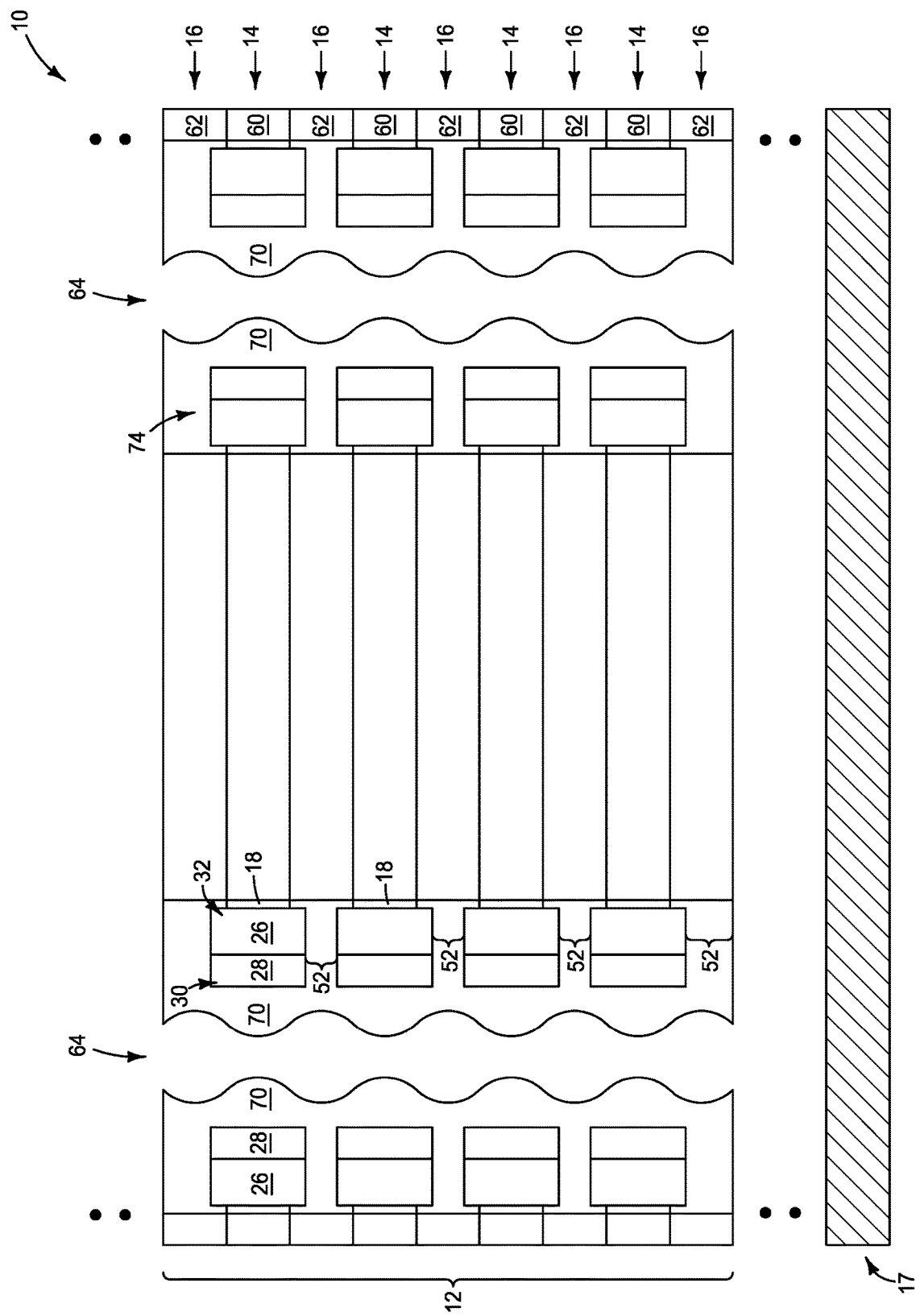
FIG. 19A is a diagrammatic cross-sectional side view of the region of the integrated assembly of FIG. 5 shown at an example process stage alternative to that of FIG. 19.

FIG. 19A shows an embodiment of similar to that of FIG. 19, but in which the insulative material 70 entirely fills the regions 52 between the vertically-adjacent segments 30, and between the vertically-adjacent segments 32 (i.e., in which the voids 74 of FIG. 19 are omitted).

Figure 20:
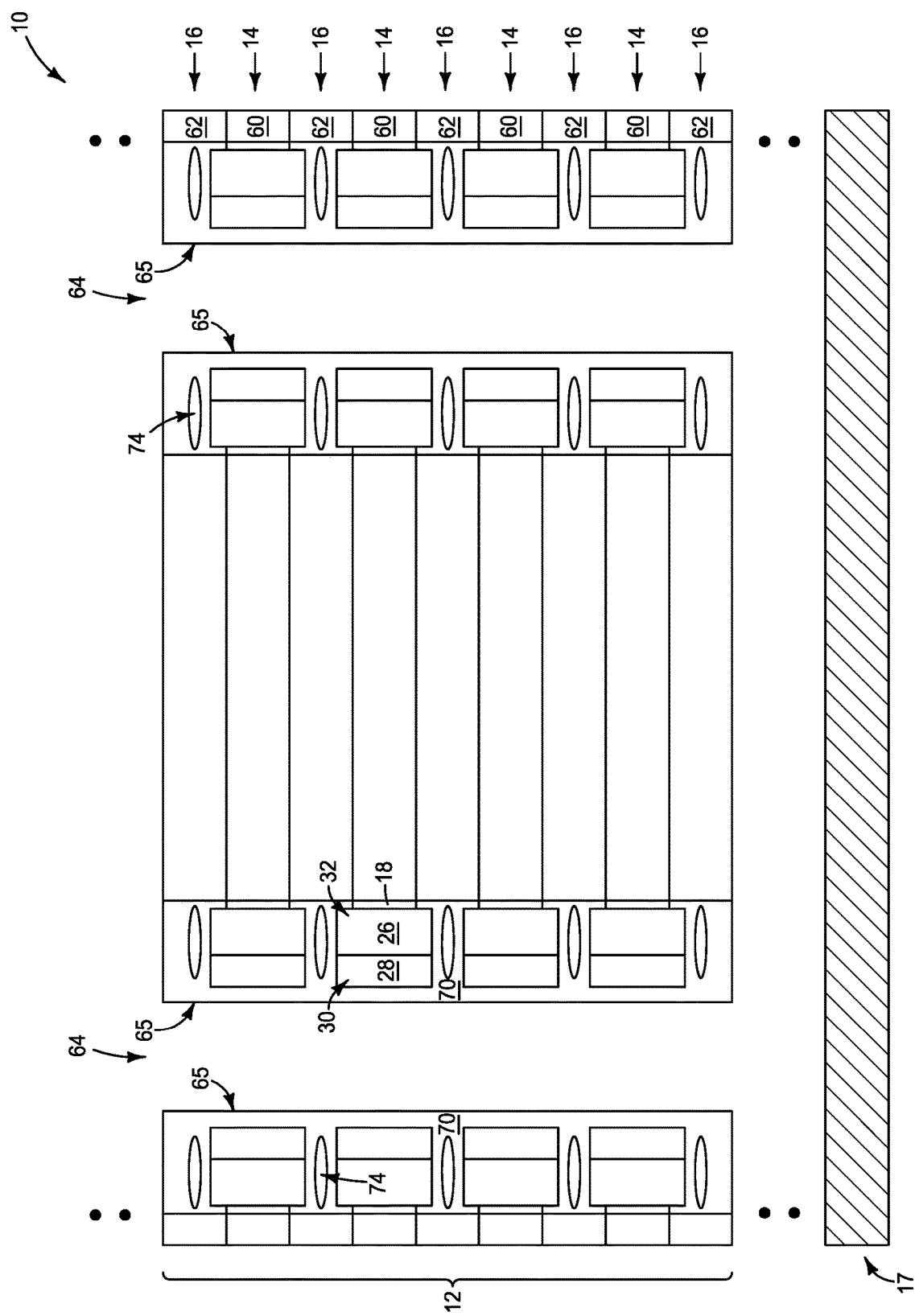
FIGS. 20-22 are diagrammatic cross-sectional side views of the region of the integrated assembly of FIG. 5 shown at example sequential process stages which may follow the process stage of FIG. 19.

Referring to FIG. 20, etching is conducted to form substantially flat vertical sidewalls 65 within the openings 64.

Figure 21:
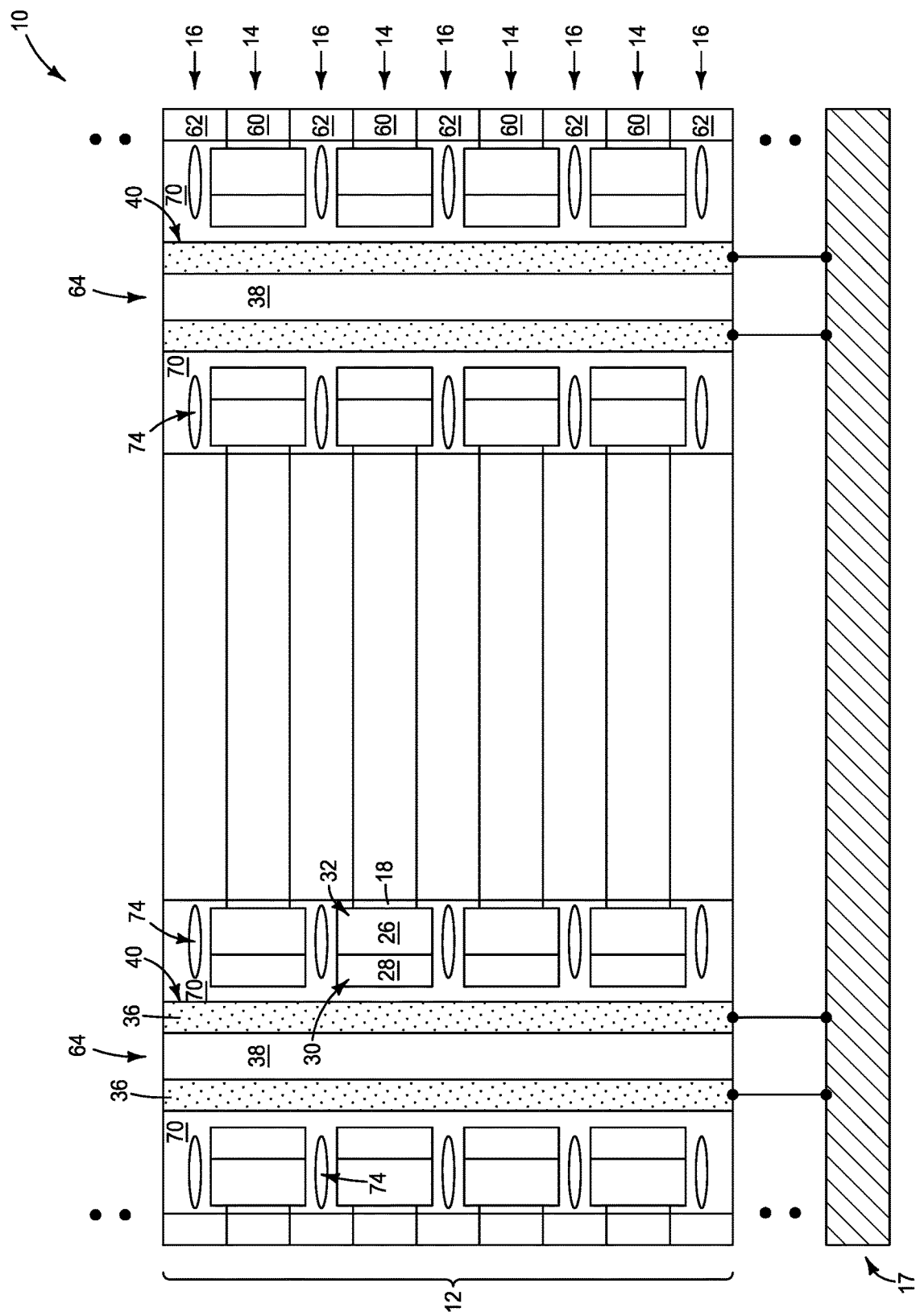

Referring to FIG. 21, the channel material 36 and insulative material 38 are formed within the openings 64. The channel material 36 is configured as vertically-extending channel-material pillars 40 that pass through the stack 12. The insulative material 70 becomes tunneling material between the channel material 36 and the charge-storage-material 28.

Figure 22:
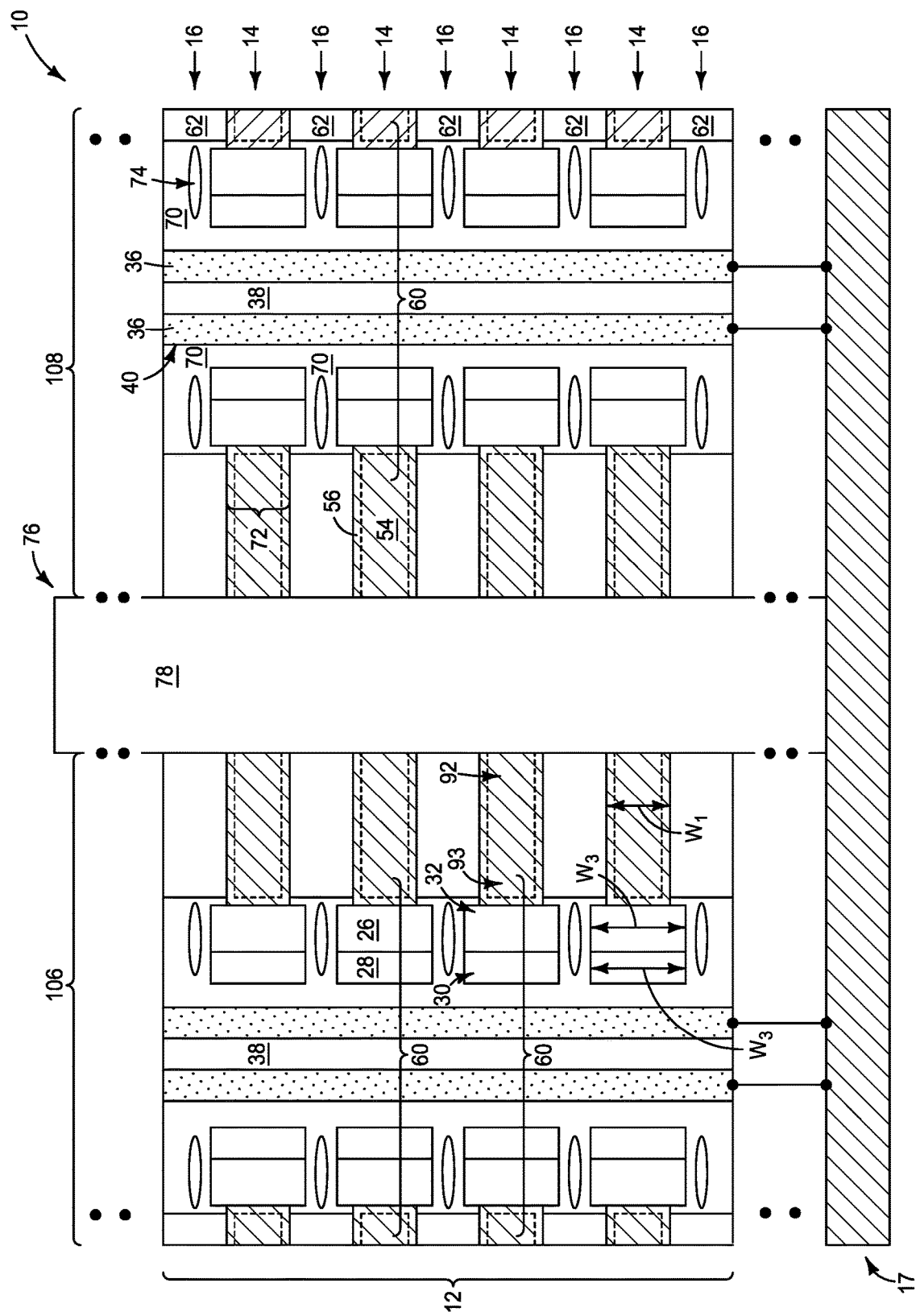

Referring to FIG. 22, the assembly of FIG. 21 is shown after processing analogous to that described above with reference to FIGS. 12-14 to form the conductive material 72 within the first levels 14, and to form the panel 76.

The configuration of FIG. 22 comprises memory cells 60 analogous to those described above with reference to FIG. 14. However, in contrast to the embodiment of FIG. 14, the charge-storage-material-segments 30 and the charge-blocking-material-segments 32 have the vertical widths $W_3$ which are larger than the vertical widths $W_1$ of the conductive levels 14. It is noted that the embodiment of FIG. 22 differs from the embodiment of FIG. 14B in that the embodiment of FIG. 22 shows that the entirety of the charge-storage-material-segments 30 and the charge-blocking-material-segments 32 have vertical widths larger than the vertical width of the conductive levels 14, whereas the embodiment of FIG. 14B showed only portions of the charge-storage-material-segments 30 having vertical widths larger than the vertical widths of the conductive levels 14.

The embodiment of FIG. 22 shows the voids 74 between the vertically-stacked charge-storage-material-segments 30 and the vertically-stacked charge-blocking-material-segments 32.

Figure 22A:
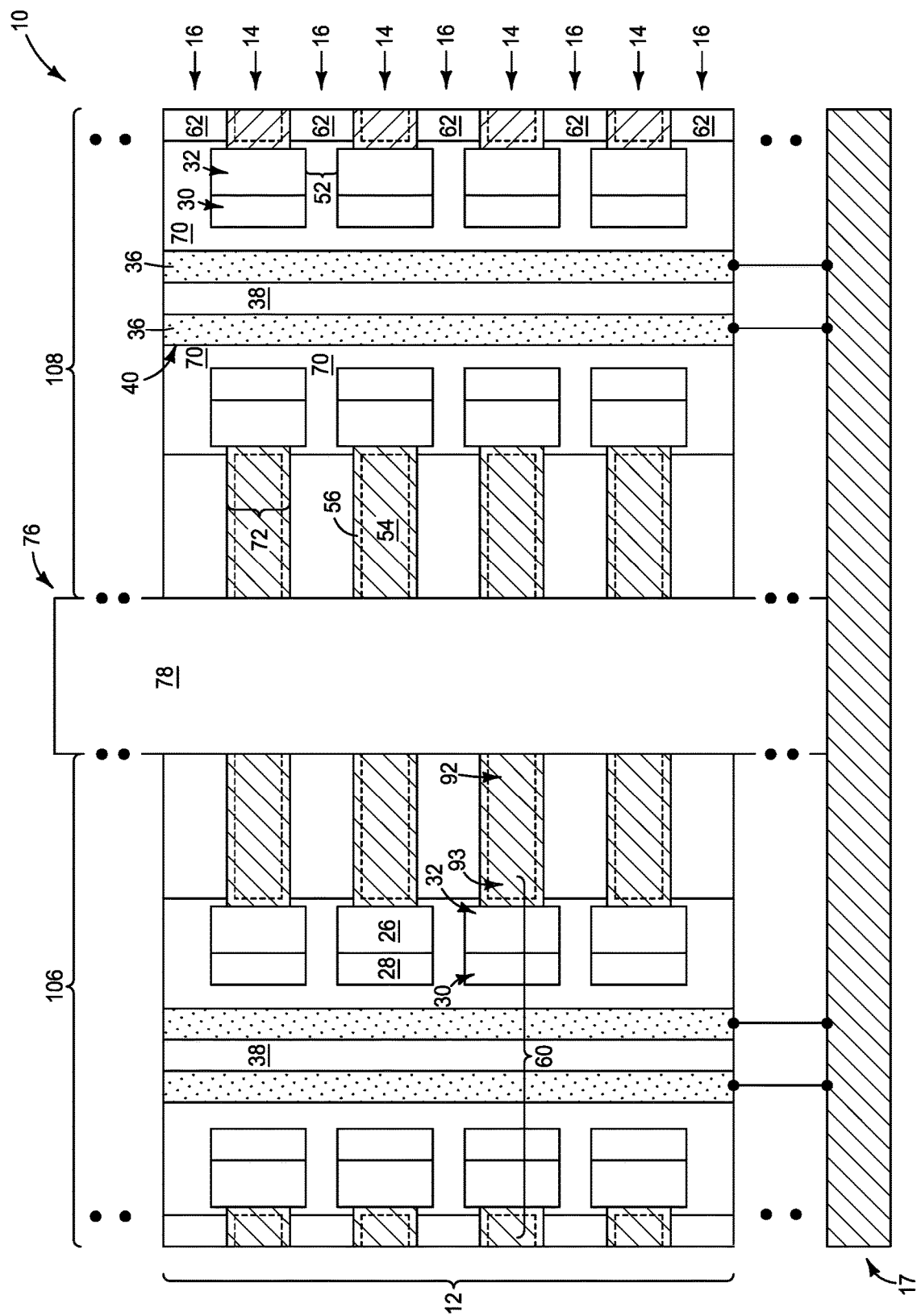
FIGS. 22A-22C are diagrammatic cross-sectional side views of the region of the integrated assembly of FIG. 5 shown at example process stages alternative to that of FIG. 22.

FIG. 22A shows a configuration analogous to that of FIG. 22, but following the process stage of FIG. 19A. Accordingly the voids 74 (FIG. 22) are not within the regions 52 between vertically-adjacent charge-storage-material-segments 30 and between vertically-adjacent charge-blocking-material-segments 32.

Figure 22B:
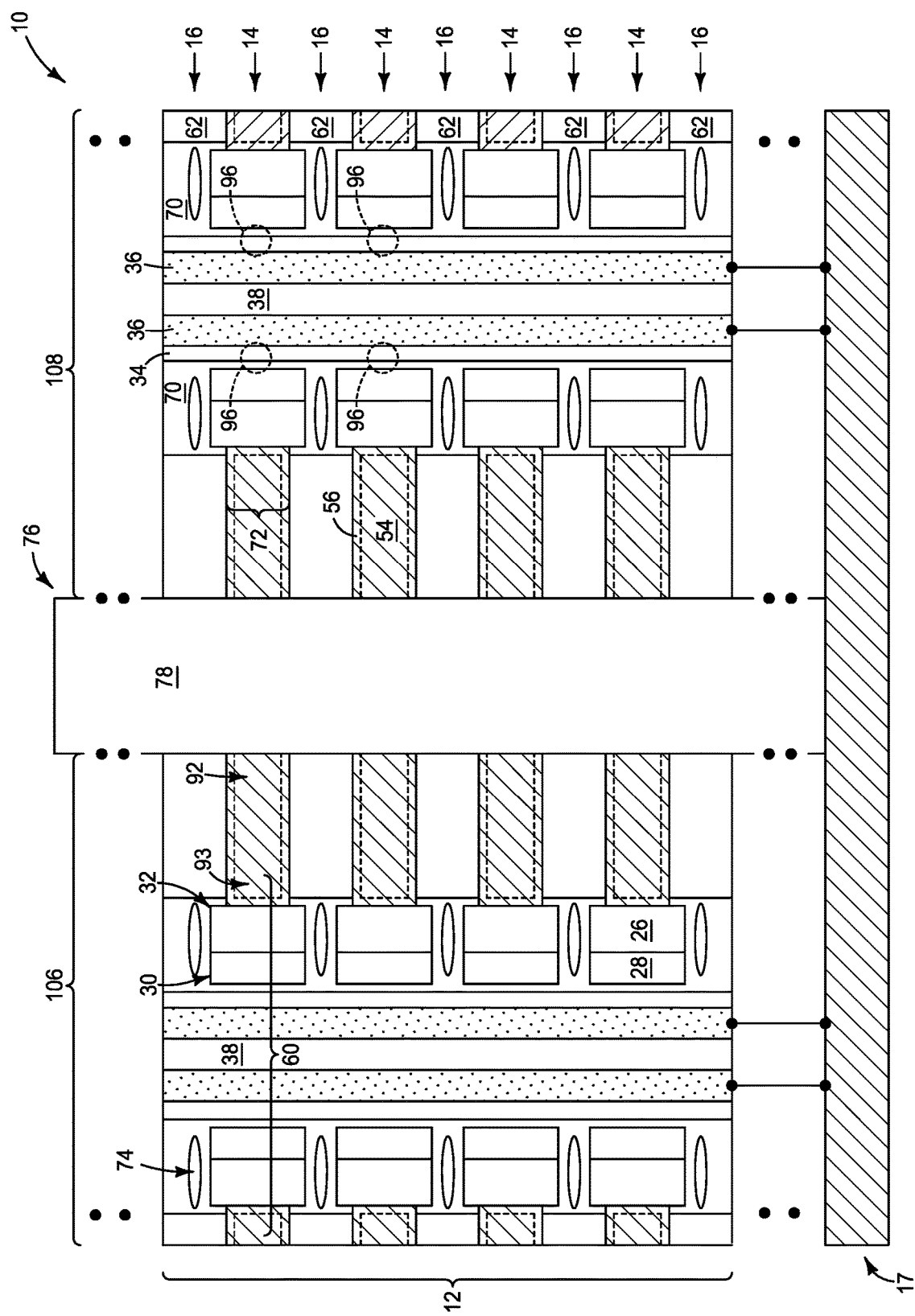
Figure 22C:
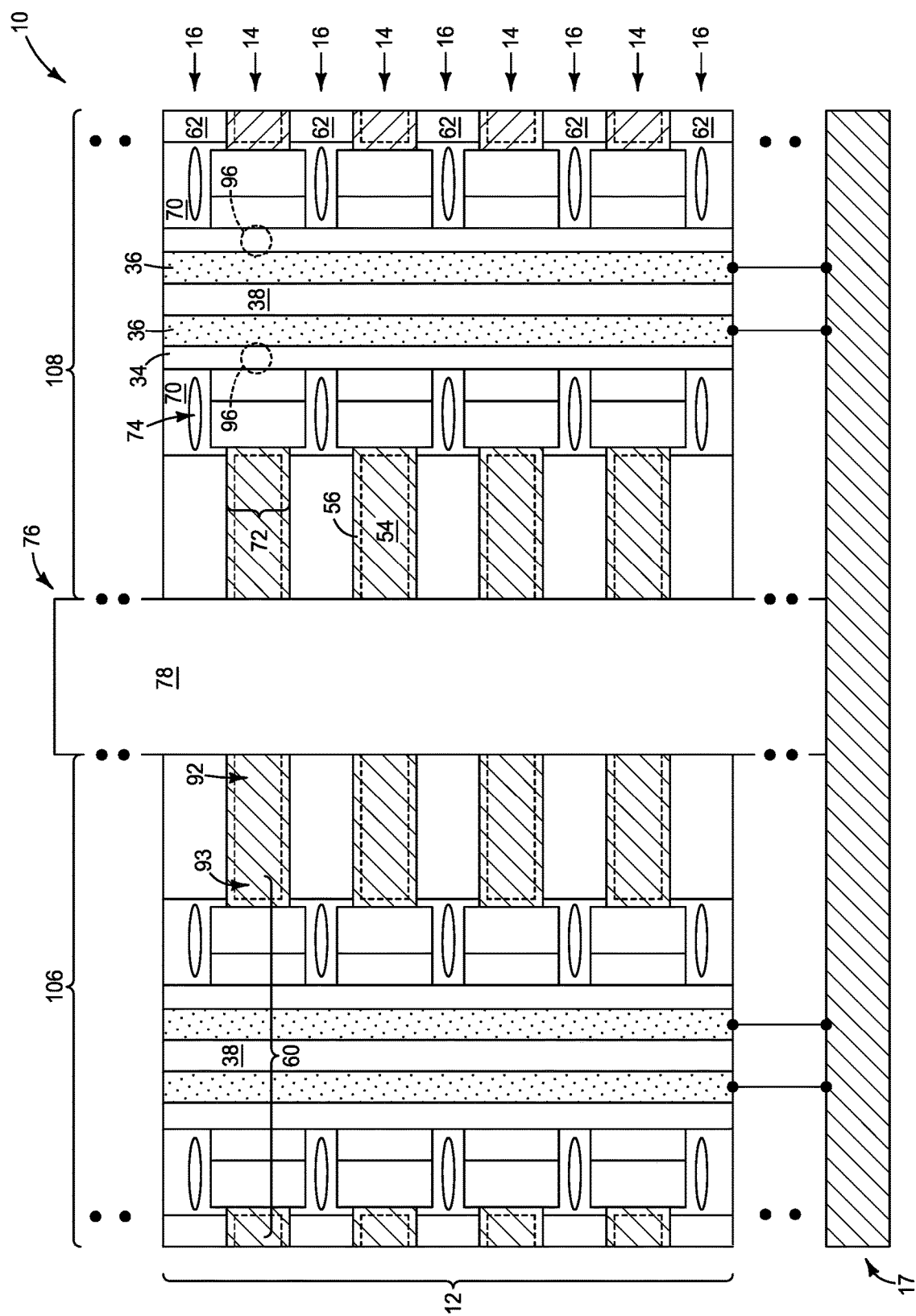

FIG. 22B shows a configuration analogous to that of FIG. 22, but in which the tunneling material 34 is provided in addition to the insulative material 70 in regions between the charge-storage-material 28 and the channel material 36. Accordingly, tunneling regions (with a couple of such tunneling regions being diagrammatically illustrated as regions 96) comprise both the material 34 and the material 70. In contrast, FIG. 22C shows a configuration in which the tunneling regions 96 only comprise the tunneling material 34. The configurations of FIGS. 22B and 22C may be fabricated by removing additional material 70 to form the flat sidewalls 65 of FIG. 20.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a stack of alternating insulative levels and conductive levels. A pillar of channel material extends through the stack. Charge-storage-material-segments are adjacent to the conductive levels of the stack, and are between the channel material and the conductive levels. The charge-storage-material-segments contain one or more high-k oxides. At least a portion of each of the charge-storage-material-segments is vertically wider than the conductive levels.

Some embodiments include an integrated assembly comprising a stack of alternating insulative levels and conductive levels. Pillars of channel material extend vertically through the stack. Charge-storage-material-segments are adjacent to the conductive levels of the stack, and are between the channel material and terminal regions of the conductive levels. The charge-storage-material-segments are arranged in first vertically-stacked configurations, and comprise one or more oxides. Tunneling material is between the charge-storage-material-segments and the channel material. Charge-blocking-material-segments is directly against the charge-storage-material-segments, and is between the charge-storage-material-segments and the terminal regions. The charge-blocking-material-segments are arranged in second vertically-stacked configurations. Insulative regions are aligned with the insulative levels. The insulative regions alternate with the charge-storage-material-segments in the first vertically-stacked configurations, and alternate with the charge-blocking-material-segments in the second vertically-stacked configurations. The insulative regions comprise voids within an insulative material, with the voids being directly between the charge-storage-material-segments of the first vertically-stacked configurations.

Some embodiments include a method of forming an integrated assembly. A vertical stack of alternating first and second levels is formed. The first levels comprise first material, and the second levels comprise second material. An opening is formed to extend through the stack. The opening has a sidewall which extends across the first and second levels. The first levels are recessed relative to the second levels along the sidewall. The second levels have projecting terminal ends which extend beyond the recessed first levels. Cavities are along the recessed first levels and are vertically between the projecting terminal ends. Third and fourth materials are formed within the cavities. The third and fourth materials are oxidized to form charge-blocking-material-segments and charge-storage-material-segments. Tunneling material is formed within the opening and adjacent to the charge-storage-material-segments. Channel material is formed within the opening and adjacent to the tunneling material. The first material is removed to form conduits. Conductive material is formed within the conduits.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising:
    a stack of alternating insulative levels and conductive levels, the insulative levels comprising an insulative material;
    an opening extending through the stack, the insulative material of the insulative levels being recessed along sidewalls of the opening relative to the conductive levels;
    a pillar of channel material extending within the opening; and
    charge-storage-material-segments entirely within the opening adjacent the conductive levels of the stack, and being between the channel material and the conductive levels; the charge-storage-material-segments being arranged in vertically-stacked configurations, with each of the vertically-stacked configurations comprising the charge-storage-material-segments alternating with insulative regions disposed within the opening; and comprising voids within the insulative regions and directly between the charge-storage-material-segments.

2. An integrated assembly comprising:
    a stack of alternating insulative levels and conductive levels, the insulative levels comprising an insulative material;
    an opening extending through the stack, the insulative material of the insulative levels being recessed along sidewalls of the opening relative to the conductive levels;
    a pillar of channel material extending within the opening; and
    charge-storage-material-segments entirely within the opening adjacent the conductive levels of the stack, and being between the channel material and the conductive levels; the charge-storage-material-segments being arranged in vertically-stacked configurations, with each of the vertically-stacked configurations comprising the charge-storage-material-segments alternating with insulative regions disposed within the opening; and comprising silicon dioxide filling an entirety of the insulative regions.

3. An integrated assembly, comprising:
    a stack of alternating insulative levels and conductive levels;
    a channel opening extending though the stack and having sidewalls along the insulative levels and the conductive levels;
    pillars of channel material extending vertically through the stack within the channel opening;
    charge-storage-material-segments adjacent the conductive levels of the stack, and being between the channel material and terminal regions of the conductive levels; the charge-storage-material-segments being arranged in first vertically-stacked configurations; the charge-storage-material-segments comprising a first oxide;
    charge-blocking-material-segments directly against the charge-storage-material-segments, and being between the charge-storage-material-segments and the terminal regions; the charge-blocking-material-segments being arranged in second vertically-stacked configurations, the charge-blocking-material-segments being entirely within the channel opening, being vertically thicker than the conductive levels, the charge-blocking-material-segments having a vertical surface in direct physical contact with the terminal regions and having an upper portion of the vertical sidewall extending above the terminal regions and having a lower portion of the vertical sidewall extending below the terminal regions;
    insulative material consisting of silicon dioxide forming insulative regions aligned with the insulative levels and covering an entirety of upper and lower surfaces of the charge-storage-material-segments and charge-blocking-material segments, the insulative material extending along an entirety of a vertical surface of the charge-storage-material segments and extending along the upper portion and lower portions of the vertical sidewall of the charge-blocking material-segments; and the insulative regions comprising voids within the insulative material, with the voids being directly between the charge-storage-material-segments of the first vertically-stacked configurations.

4. The integrated assembly of claim 3 wherein the voids are also between the charge-blocking-material-segments of the second vertically-stacked configurations.

5. The integrated assembly of claim 3 wherein said first and second oxides include one or more of AlO, HfO, ZrO, TiO, LaO, ScO and TaO, where the chemical formulas indicate primary constituents rather than specific stoichiometries.

6. The integrated assembly of claim 3 wherein the conductive levels include one or more of tungsten, tantalum, molybdenum, tantalum nitride and titanium nitride.

* * * * *